United States Patent
Lai et al.

(10) Patent No.: US 11,557,590 B2
(45) Date of Patent: Jan. 17, 2023

(54) TRANSISTOR GATE PROFILE OPTIMIZATION

(71) Applicant: Taiwan Semiconductor Manufacturing Co., Ltd., Hsin-Chu (TW)

(72) Inventors: Chi-Sheng Lai, Hsinchu (TW); Wei-Chung Sun, Hsinchu (TW); Li-Ting Chen, Hsinchu (TW); Kuei-Yu Kao, Hsinchu (TW); Chih-Han Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 138 days.

(21) Appl. No.: 16/899,268

(22) Filed: Jun. 11, 2020

(65) Prior Publication Data
US 2021/0257359 A1    Aug. 19, 2021

Related U.S. Application Data

(60) Provisional application No. 62/978,564, filed on Feb. 19, 2020.

(51) Int. Cl.
*H01L 27/088* (2006.01)
*H01L 29/78* (2006.01)
(Continued)

(52) U.S. Cl.
CPC .. *H01L 27/0886* (2013.01); *H01L 21/823431* (2013.01); *H01L 21/823437* (2013.01);
(Continued)

(58) Field of Classification Search
CPC ..... H01L 21/823828; H01L 21/823456; H01L 21/823437; H01L 27/0886; H01L 29/66795; H01L 29/785
See application file for complete search history.

(56) References Cited

U.S. PATENT DOCUMENTS 7,667,271 B2    2/2010  Yu et al.
8,362,575 B2    1/2013  Kwok et al.
(Continued)

FOREIGN PATENT DOCUMENTS

KR    20180029037 A    3/2018
KR    20180062337       6/2018
(Continued)

*Primary Examiner* — Tuan A Hoang
(74) *Attorney, Agent, or Firm* — Haynes and Boone, LLP

(57) ABSTRACT

A device includes a plurality of fin structures that each protrude vertically upwards out of a substrate and each extend in a first direction in a top view. A gate structure is disposed over the fin structures. The gate structure extends in a second direction in the top view. The second direction is different from the first direction. The fin structures have a fin pitch equal to a sum of: a dimension of one of the fin structures in the second direction and a distance between an adjacent pair of the fin structures in the second direction. An end segment of the gate structure extends beyond an edge of a closest one of the fin structures in the second direction. The end segment has a tapered profile in the top view or is at least 4 times as long as the fin pitch in the second direction.

20 Claims, 22 Drawing Sheets

(51) Int. Cl.
   *H01L 21/8234*   (2006.01)
   *H01L 29/66*   (2006.01)
(52) U.S. Cl.
   CPC .. *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,669,596 B2 * | 3/2014 | Tamaru | H01L 29/4238 257/206 |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 2008/0001176 A1 * | 1/2008 | Gopalakrishnan | H01L 27/115 257/E27.103 |
| 2011/0068407 A1 | 3/2011 | Yeh et al. | |
| 2012/0292666 A1 | 11/2012 | Tamaru | |
| 2013/0011983 A1 | 1/2013 | Tsai et al. | |
| 2014/0252412 A1 | 9/2014 | Tsai et al. | |
| 2016/0379928 A1 * | 12/2016 | Christensen | H01L 23/50 257/300 |
| 2017/0025533 A1 * | 1/2017 | Phoa | H01L 27/0886 |
| 2017/0179118 A1 | 6/2017 | Chang et al. | |
| 2017/0287909 A1 * | 10/2017 | Oh | H01L 23/528 |
| 2018/0130799 A1 * | 5/2018 | Shimbo | H01L 27/0886 |
| 2018/0151387 A1 | 5/2018 | Liu et al. | |
| 2019/0131303 A1 * | 5/2019 | Yoshitani | H01L 29/78 |

FOREIGN PATENT DOCUMENTS

| | | |
|---|---|---|
| TW | 201730794 A | 9/2017 |
| TW | 202001417 A | 1/2020 |
| TW | 202001636 A | 1/2020 |
| TW | 202002032 A | 1/2020 |
| TW | 202008438 A | 2/2020 |

* cited by examiner

TRANSISTOR GATE PROFILE OPTIMIZATION

PRIORITY DATA

The present application is a utility U.S. patent application claiming priority to U.S. Provisional Patent Application No. 62/978,564, filed on Feb. 19, 2020, and entitled "Gate Shape and Length Optimization", the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication processes performed to define gate structures of transistors may generate residue or unwanted byproduct. As device sizes continue to shrink, the risk of electrical shorting caused by such residue or byproduct may also increase, which may lead to lower yields or worse device performance.

Therefore, although conventional methods of forming gate structures have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figures 1A, 1B:
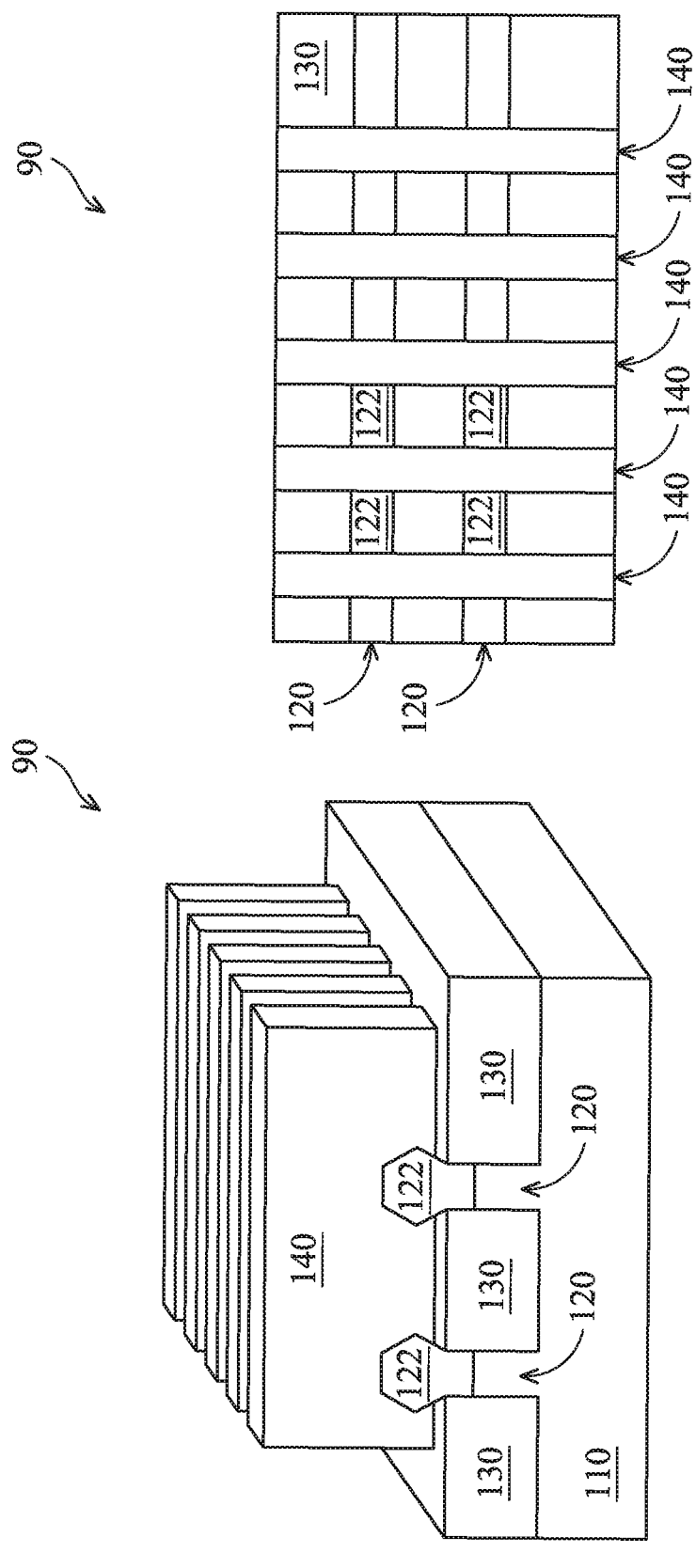
FIG. 1A is a perspective view of an IC device in the form of a FinFET according to various aspects of the present disclosure.
FIG. 1B is a planar top view of an IC device in the form of a FinFET according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs, three-dimensional fin-line FETs (FinFETs), or gate-all-around (GAA) devices. One aspect of the present disclosure involves forming a dipole layer directly on an interfacial layer in a gate structure, and then using multiple interfacial-layer-patterning processes to achieve different threshold voltages for different devices. This improves the flexibility in tuning the threshold voltage and reduces gate resistance compared to conventional devices, as discussed below in more detail.

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed.

For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fins 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fins 120. The source/drain features 122 may include epi-layers that are epitaxially grown on the fin structures 120.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fins 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fins 120, a capping layer, other suitable layers, or combinations thereof.

Referring to FIG. 1B, multiple fins 120 are oriented lengthwise along the X-direction, and multiple gate structure 140 are oriented lengthwise along the Y-direction, i.e., generally perpendicular to the fins 120. In many embodiments, the IC device 90 includes additional features such as gate spacers disposed along sidewalls of the gate structures 140, hard mask layer(s) disposed over the gate structures 140, and numerous other features.

Figure 1C:
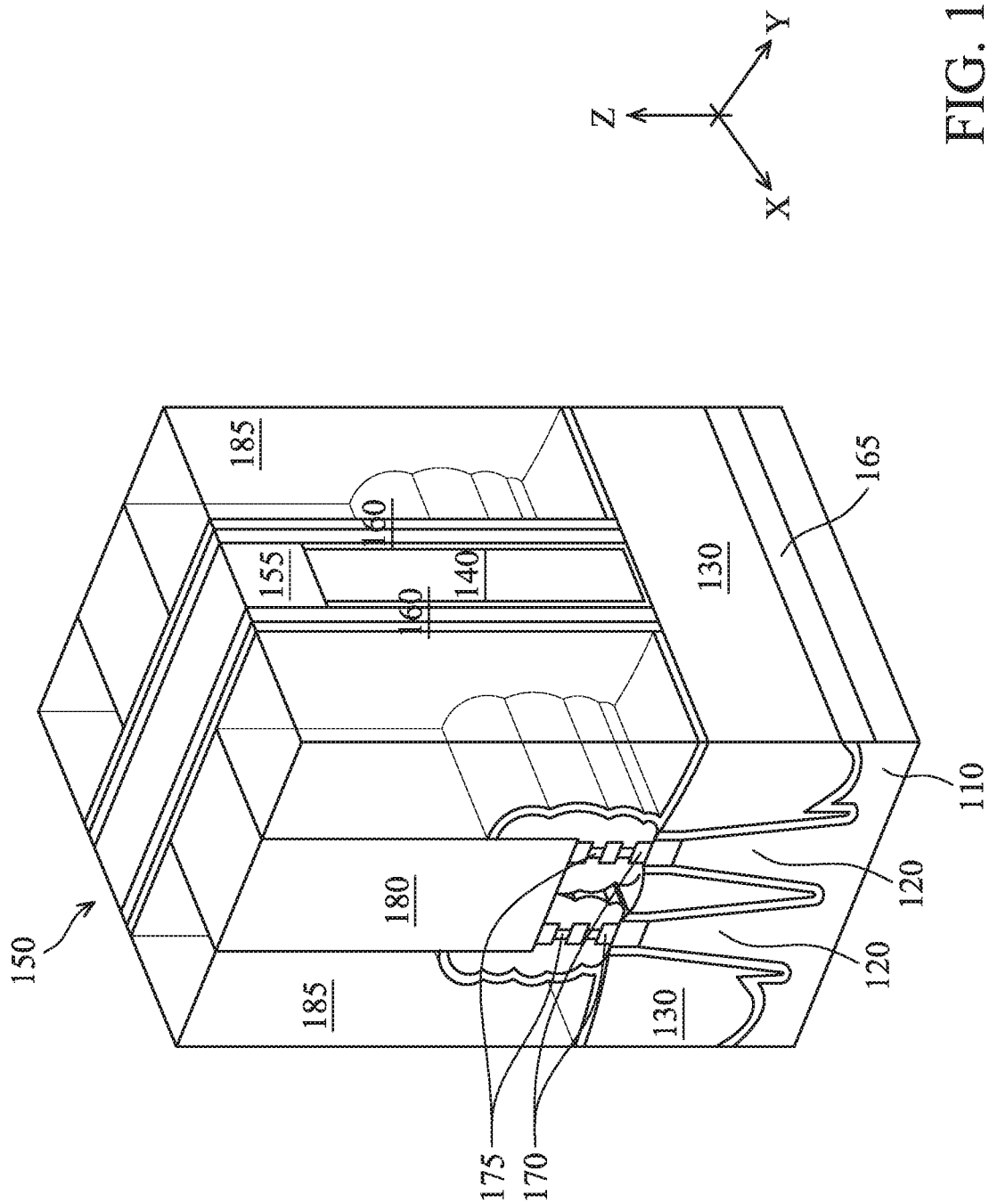
FIG. 1C is a perspective view of an IC device in the form of a GAA device according to various aspects of the present disclosure.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130. A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric layer. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2-13 illustrate diagrammatic fragmentary top views of different portions of IC devices at various stages of fabrication. For example, FIGS. 2-13 illustrates diagrammatic fragmentary top views of IC devices 200A, 200B, 200C, 200D, and 200E. In some embodiments, the IC devices 200A, 200B, 200C, 200D, and 200E may be fabricated on the same wafer (or the same IC chip), but they may be fabricated using different processes. For reasons of consistency and clarity, similar components appearing in FIGS. 2-13 and FIGS. 1A-1B will be labeled the same.

Figure 2:
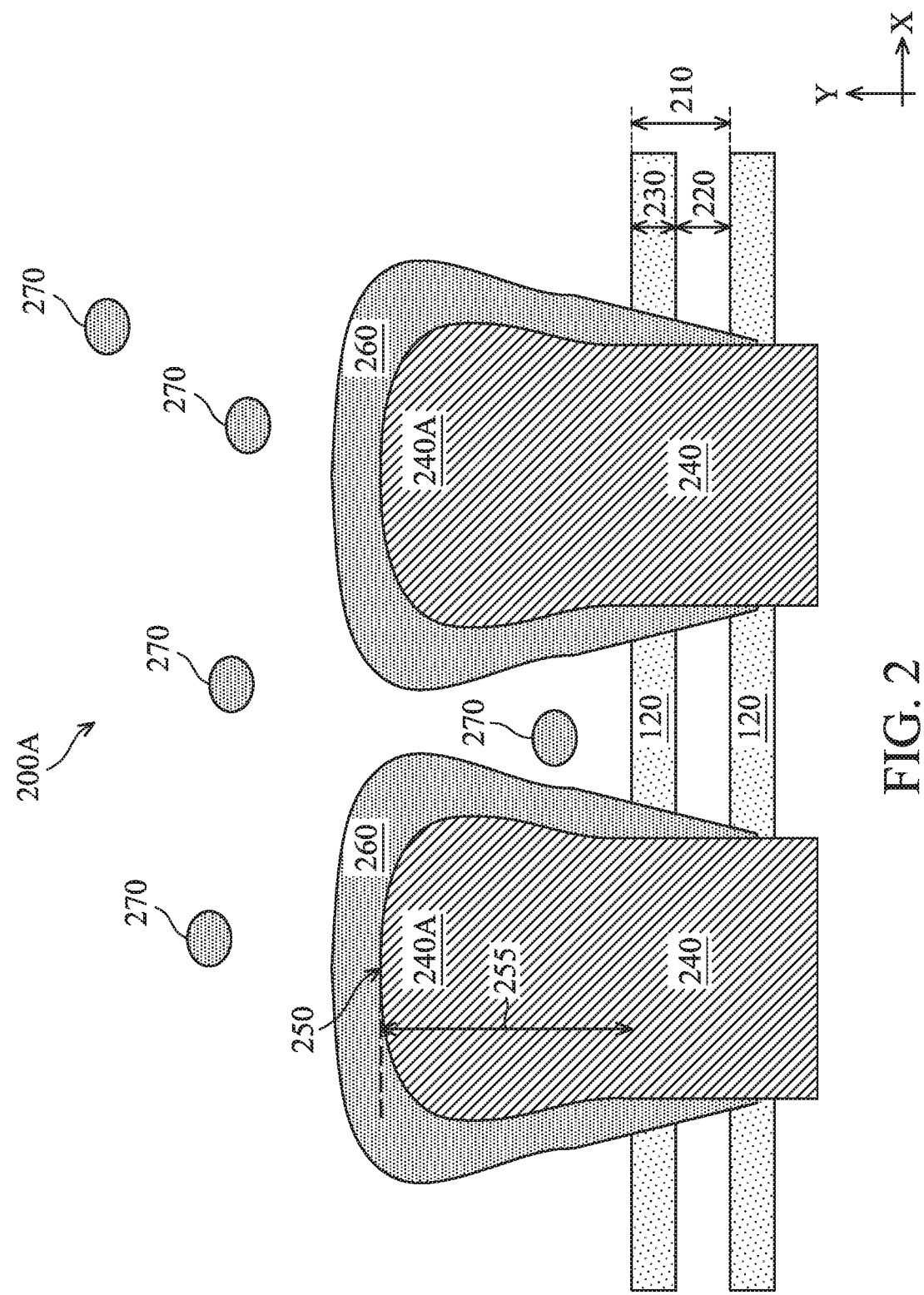
FIGS. 2-18 are top views of various embodiments of IC devices at various stages of fabrication according to various aspects of the present disclosure.
Figure 3:
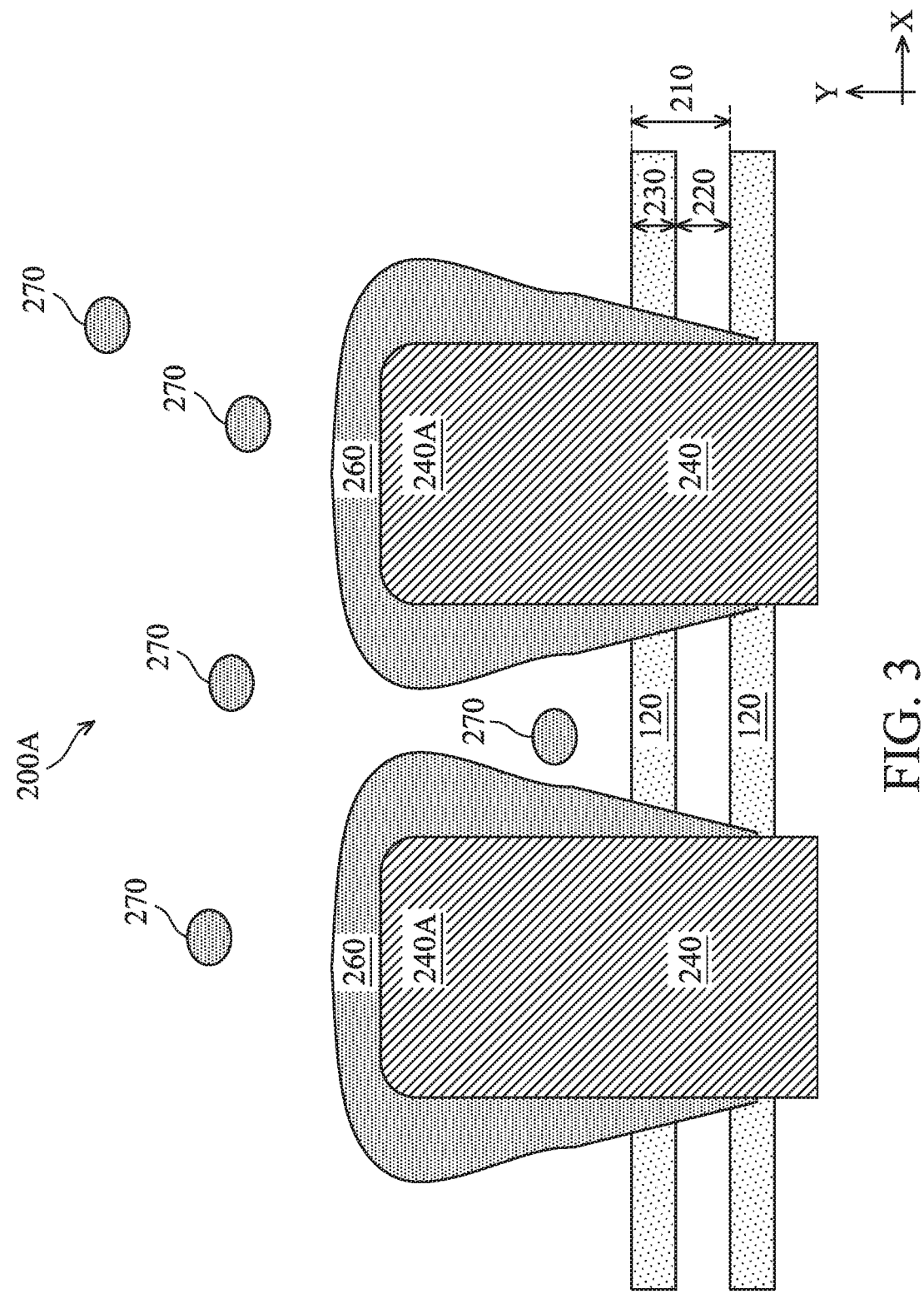

Referring to FIG. 2, the IC device 200A includes a plurality of active regions, for example the fin structures 120 discussed above with reference to FIGS. 1A-1B. The fin structures 120 each extends in the X-direction, and they are separated from one another in the Y-direction. The fin structures 120 have a pitch 210 measured in the Y-direction, which may be a sum of a spacing 220 between two adjacent fin structures 120 and a width 230 of one of the fin structures 120 in the Y-direction. Alternatively stated, the pitch 210=the spacing 220+the width 230.

The IC device 200A includes gate structures 240 overlying the fin structures 120 in the top view of FIG. 2. It is understood that in a cross-sectional view or in a 3-dimensional view, the gate structures 240 would be formed over and partially wrapped around the fin structures 120, for example in a manner similar to how the gate structures 140 are formed over and wrapped around the fin structures 120 in FIG. 1A. In some embodiments, the gate structures 240 include dummy gate structures and may hereinafter be interchangeably be referred to as such. For example, the dummy gate structures 240 may each include a dummy polysilicon gate electrode, and possibly a dummy silicon oxide gate dielectric in some embodiments. As dummy gate structures 240, the dummy polysilicon gate electrode (and the dummy silicon oxide gate dielectric if they are included) will be removed in a gate replacement process and will be replaced by high-k metal gate (HKMG) structures that include a metal gate electrode and a high-k gate dielectric. The HKMG structures may substantially assume or inherit the top view shape or profile of the dummy gate structures 240.

It is understood that in FIG. 2, only a portion of each of the dummy gate structures 240 is shown due to space considerations. For example, each dummy gate structure 240 may include an elongated body segment that is joined by two opposite end segments 240A. In some embodiments, the end segment 240A may refer to the portion of the dummy gate structure 240 extending beyond the edge of the outermost fin structure 120. For example, the end segment 240A may have an outermost tip 250 in the Y-direction, which is spaced apart from the nearest fin structure 120 by a distance 255. In some embodiments, the distance 255 is less than about 3 times the pitch 210 associated with the fin structures 120. In some embodiments, the distance 255 is between about 0.5 and about 3 times the pitch 210.

Note that only one such end segment 240A is shown along with a portion of the body segment. The other end segment (e.g., opposite to the end segment 240A in the Y-direction) and the rest of the body segment are omitted from illustration in FIG. 2 due to space considerations.

As shown in FIG. 2, the end segment 240A may have an outwardly protruding contoured profile (e.g., bulging convexly in both the X-direction and the Y-direction). This may be an unintended result of lithography effects. In more detail, the dummy gate structures 240 may be formed by depositing a dummy gate layer (e.g., a polysilicon layer) over a substrate (including over the fin structures 120), defining a mask structure (e.g., a photoresist structure and/or a hard mask structure) over the dummy gate layer, and etching the dummy gate layer while the mask structure serves as an etching mask. The shape or profile of the mask structure is defined by a mask pattern of a lithography mask. Portions of the dummy gate layer underneath the mask structure are protected from being etched, while the exposed portions of the dummy gate layer are etched away. The remaining portions of the dummy gate layer form the dummy gate structures 240.

In many cases, the mask pattern on the lithography mask may have a rectangular or polygonal profile. In older technology generations where device sizes are much larger, the dummy gate structure may mostly inherit the top view shape and/or profile of the mask pattern on the lithography mask and as such may have a profile resembling a rectangle or polygon. However, as device sizes continue to shrink, optical effects of the photolithography process may distort the profile of the patterns formed on a wafer. For example, the mask structure (formed over the dummy gate layer) according to the mask pattern on the lithography mask may not preserve the rectangular/polygonal profile and may instead be formed to have outwardly protruding contours at the end segments. Therefore, the end segments 240A of the dummy gate structure 240 may also have the outwardly protruding contours, as shown in FIG. 2.

Note that the outwardly protruding contour profile is not required for the end segments 240A. In some cases, the end segments 240A may each have a top view profile that more closely resembles a rectangle, but with somewhat curved edges (for example at the corners), such as the ones illustrated in FIG. 3.

Referring back to FIG. 2, due to imperfections in the lithography process, a residue or byproduct 260 may be formed around the end segments 240A and even portions of the body segment of the dummy gate structure 240. In more detail, the etching process discussed above to etch the dummy gate layer (while the mask structure serves as an etching mask) may use gases that contain fluorine (F), chlorine (Cl), and/or bromine (Br). These gases may react with the polysilicon material of the dummy gate layer to generate the residue or byproduct 260, which may contain polysilicon and/or elements of the gases. For example, the residue or byproduct 260 may contain $SiF_4$ or $Si_2OCl_6$ in some cases.

Portions of the residue or byproduct 260 may be dispersed as particles 270 around the dummy gate structures 240. Typically, the fabrication tools used to fabricate the IC device 200A may employ suction or fan mechanisms to remove the residue or byproduct 260 and the particles 270. The removal of the residue or byproduct 260 is not too difficult, since they are typically not surrounded by densely packed structures at this stage of fabrication. However, the removal of the particles 270 may be more difficult, especially if the particles 270 are trapped between adjacent fin structures 120 (which may resemble two adjacent vertically protruding walls around the particles 270). For example, the vertically protruding fin structures 120 may interfere with the suction forces used to remove the particles 270, which may lead to an incomplete removal of the particles 270.

The incomplete removal of the particles 270 could cause electrical shorting problems. For example, in the gate replacement process to be performed later, the dummy gate structures 240 are replaced by HKMG structures. Since any remaining particles 270 and the dummy gate structures 240 have similar material compositions (e.g., both containing polysilicon), the remaining particles 270 may also be replaced by HKMG structures, even though this is unintentional. Effectively, undesired "extra" HKMG structures would be formed in locations corresponding to the remaining particles 270. These "extra" HKMG structures could short out components of the IC device 200A. For example, if the remaining particles 270 are located between the fin structures 120 and/or overlap with a location of a to-be-formed conductive source/drain contact (typically located between the adjacent dummy gate structures 240), the "extra" HKMG structures corresponding to the remaining particles 270 may cause undesirable electrical shorting between the HKMG structures and the conductive source/drain contacts. Such an electrical shorting may degrade device performance such as voltage breakdown (also referred to as breakdown voltage) VBD and may lead to lower yields.

It is understood that for certain structures, such electrical shorting may not be as big of a concern. For example, for devices that have larger spacing between adjacent gate structures, the particles 270 may be easier to remove, and even the unremoved particles 270 may still be located sufficiently far away from sensitive structures such as the fin structures 120 and/or the source/drain contacts. As such, the undesirable electrical shorting may not occur even if the "extra" HKMG structures are present. As another example, if the IC device 200A is implemented using planar structures rather than fin structures, the particles 270 would be much easier to remove, since there may not be vertically-standing walls (e.g., corresponding to the vertically protruding fin structures 120) located around the particles 270. Hence, planar devices may not have the particles 270 by the time the gate replacement process is performed. As such, no "extra" HKMG gate structures would be formed for the planar devices, and thus no undesirable electrical shorting would occur.

Figure 4:
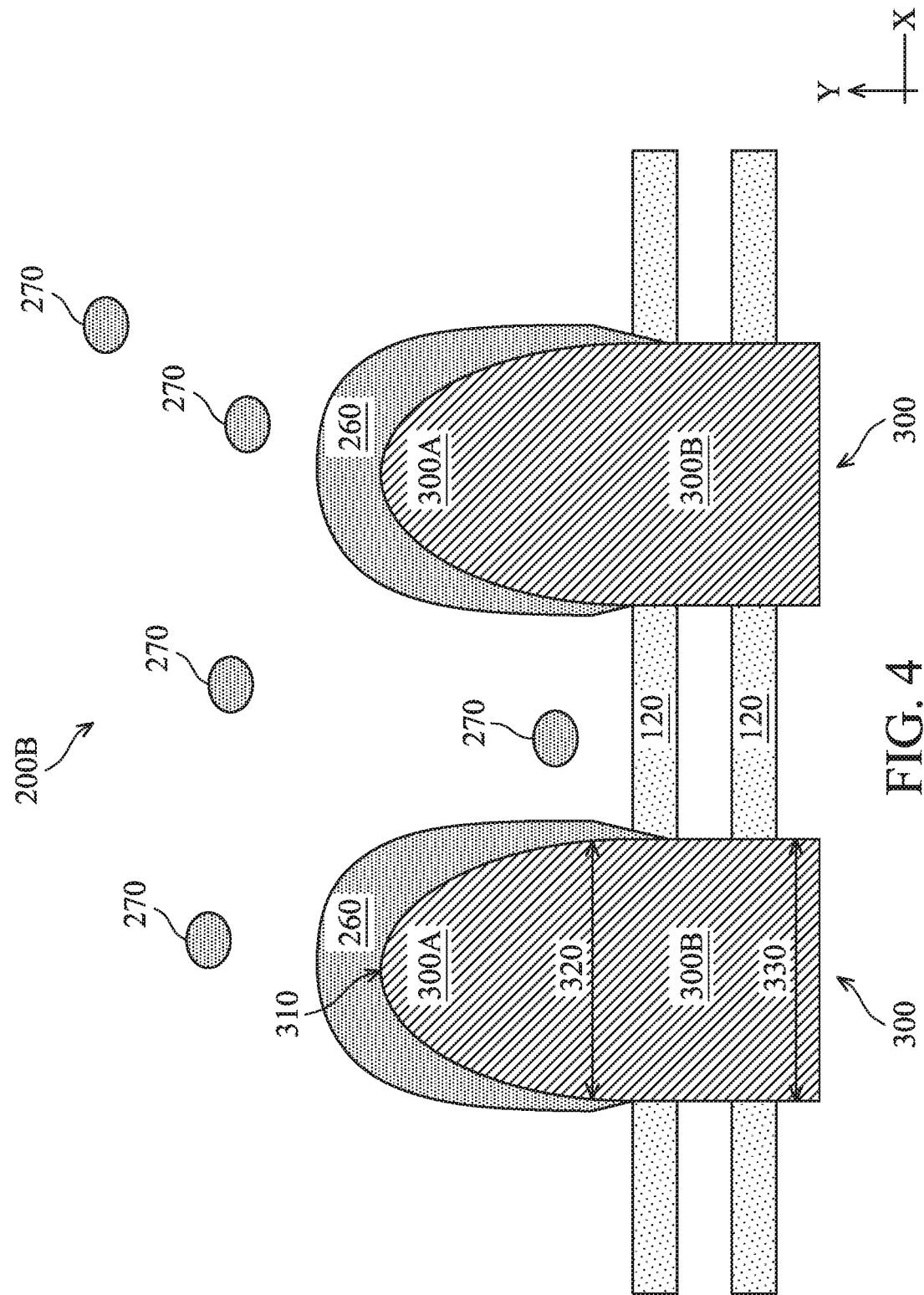

Nevertheless, since the electrical shorting discussed above could be a problem for IC devices with tighter spacing (e.g., greater pattern density) and/or FinFET devices (including multi-channel gate-all-around (GAA) devices), the present disclosure seeks to optimize the shape and/or profile of the gate structures to minimize the electrical shorting risks. For example, FIG. 4 is a diagrammatic fragmentary top view of an IC device 200B illustrating an optimized dummy gate shape profile according to an embodiment. For reasons of consistency and clarity, similar components appearing in FIGS. 2-4 will be labeled the same.

Referring to FIG. 4, the IC device 200B includes the fin structures 120 as well as a plurality of dummy gate structures 300 that are formed over and partially wrapped around the fin structures 120 in the manner similar to what is shown in FIG. 1A. The dummy gate structures 300 have end segments 300A that extend beyond the edge of the outermost fin structure 120 in the Y-direction. Unlike the end segments 240A of the dummy gate structures 240 in FIG. 2, the end segments 300A in FIG. 4 have an inwardly tapered top view profile. For example, the end segment 300A may have a tip 310 that is a farthermost point of the end segment 300A from the fin structure 120. The end segment 300A may also have a dimension 320 (measured in the X-direction) that varies as a function of location within the end segment 300A, or as a function of distance from the closest fin structure 120. Meanwhile, the body 300B of the dummy gate structure 300 has a dimension (measured in the X-direction) that remains relatively constant regardless of the location within the body.

In the embodiment shown in FIG. 4, the dimension 320 gradually shrinks as the distance from the fin structure 120 grows (i.e., as the end segment 300A extends farther beyond the fin structures 120). For example, at a first location that is located closer to the fin structure 120, the dimension 320 may have a first value. At a second point that is located farther away from the fin structure 120 than the first location, the dimension 320 may have a second value smaller than the first value. In some embodiments, the tapered profile of the end segment 300A is curved and substantially smooth, that is, the dimension 320 may shrink continuously and gradually as the distance away from the fin structure 120 increases. In other embodiments, the tapered profile of the end segment 300A may not be completely smooth such that it may have some flat or jagged edges (e.g., if the shrinking of the dimension 320 is not continuous). For example, the end segment 300A may be shaped similar to a triangle or similar to a polygon in the top view, so long as the portion that is farther away from the fin structures 120 is narrower in the X-direction than the portion that is closer to the fin structures.

In some embodiments, the tapered profile of the end segment 300A may also manifest itself as the end segment 300A being narrower on average than a body 300B of the dummy gate structure 300. For example, the end segment 300A may have a first average width (measured in the X-direction), which may be an average of all the different dimensions 320 taken at different locations of the end segment 300A. Meanwhile, the body 300B may have a second average width (measured in the X-direction), which may be an average of all the different dimensions 330 taken at different locations of the body 300B. Since the end segment 300A is tapered, the first average width of the end segment 300A is substantially less than the second average width of the body 300B. In some embodiments, a ratio between the first average width and the second average width is in a range between about 0.5 and about 0.78. The above ratio range is not randomly chosen but specifically configured to ensure that the curvature or the tapering of the end segment 300A is sufficient to allow for the substantially complete removal of the particles 270, while also ensuring that the end segment 300A is not too narrow to adversely affect the functionality of the gate.

The inwardly tapered profile of the end segment 300A helps alleviate the problems caused by the particles 270. For example, even if particles 270 are formed, they are more easily removed from the IC device 200B during a cleaning process performed after the patterning of the dummy gate structures 300. This is because the inwardly tapered profile of the end segments 300A effectively create a bigger and more vacant area for the particles 270. As such, the particles 270 are less likely to be trapped (e.g., stuck between the adjacent dummy gate structures 300 or between the fin structures 120). Hence, the particles 270 generated during the fabrication of the IC device 200B can be more easily suctioned off or otherwise removed, thereby obviating potential problems caused by the presence of remaining particles 270 discussed above in association with FIG. 2. In some embodiments, the tapered profile of the end segment 300A allows all of the particles 270 (and the byproduct 260) to be removed during the cleaning process.

Figure 5:
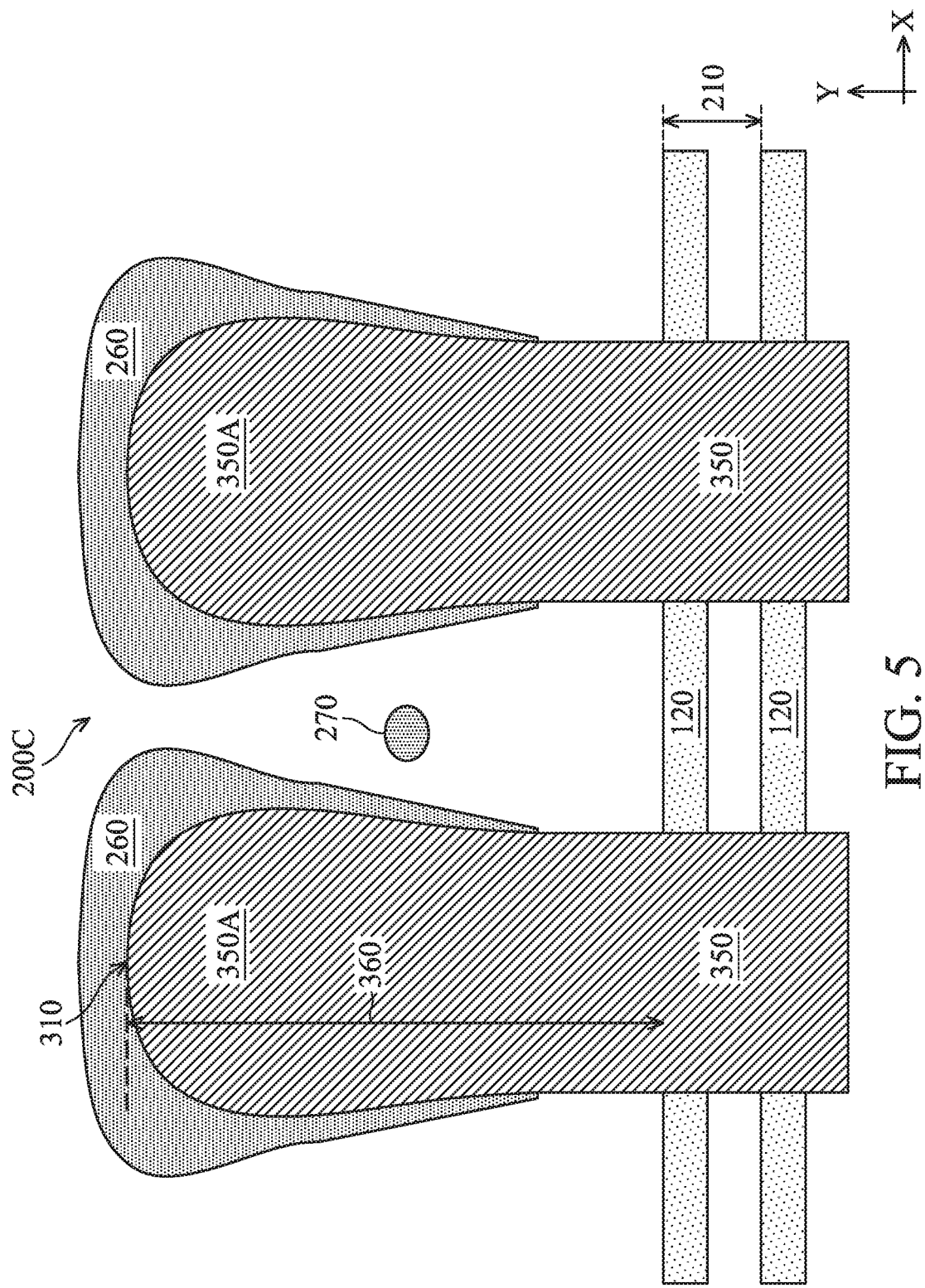

FIG. 5 is a diagrammatic fragmentary top view of an IC device 200C illustrating an optimized dummy gate shape profile according to another embodiment. For reasons of consistency and clarity, similar components appearing in FIGS. 2-5 will be labeled the same. Referring to FIG. 5, the IC device 200C includes the fin structures 120 as well as a plurality of dummy gate structures 350 that are formed over and partially wrapped around the fin structures 120 in the manner similar to what is shown in FIG. 1A.

The dummy gate structures 350 have end segments 350A that extend beyond the outermost fin structure 120 in the Y-direction. Although the end segments 350A are shown as having an outwardly protruding shape or profile (e.g., somewhat similar to the end segments 240A of FIG. 2), it is understood that they may have a rectangular profile (e.g., similar to the end segments 240A in FIG. 3) or an inwardly tapered profile (e.g., similar to the end segments 300A of FIG. 4) in other embodiments. However, unlike the end segments 240A and/or 300A, the end segment 350A extends beyond the closest fin structure 120 much farther. In other words, the end segment 350A is stretched out or more elongated in the Y-direction than the end segments 240A. For example, the outermost tip 310 of the end segment 350A is spaced apart from the edge of the closest fin structure 120 by a distance 360. In some embodiments, the distance 360 is at least 4 times as long as the pitch 210 associated with the fin structures 120. In some embodiments, the distance 360 is in a range between about 4 times and about 8 times the pitch 210. In comparison, the distance 255 (see FIG. 2) associated with the dummy gate structure 240 is less than about 3 times the pitch 210. The above range is not randomly chosen but specifically configured such that the distance 360 is sufficiently long to ensure the particles 270 (if any are generated) is located far enough from the fin structures 120, so that they can be easily removed according to the various aspects of the present disclosure. Meanwhile, the above range also ensures that the distance 360 is not too long to consume an unwarranted large amount of chip space/area. In other words, the above range is optimized in the sense that it facilitates the removal of the undesirable particles 270, without sacrificing valuable chip real estate too much.

The fact that the end segment 350A is more stretched out or elongated also helps to alleviate the problems discussed above caused by the particles 270. For example, even if particles 270 are formed, due to the now-greater distance 360 from the fin structures 120, the particles 270 are less likely to be formed close to the fin structures 120. This allows the particles 270 to be more easily removed, since the particles 270 are not located in a region that is as densely populated (e.g., by fin structures 120) compared to the particles in the case of FIG. 2. In addition, even if some particles 270 are not removed and are transformed into the HKMG-containing structures in the later fabrication stages, the likelihood of electrical shorting with the fin structures 120 and/or with the conductive source/drain contacts is still low, since there is greater separation between the HKMG-containing structures and the fin structures 120 and/or the conductive source/drain contacts.

Figure 6:
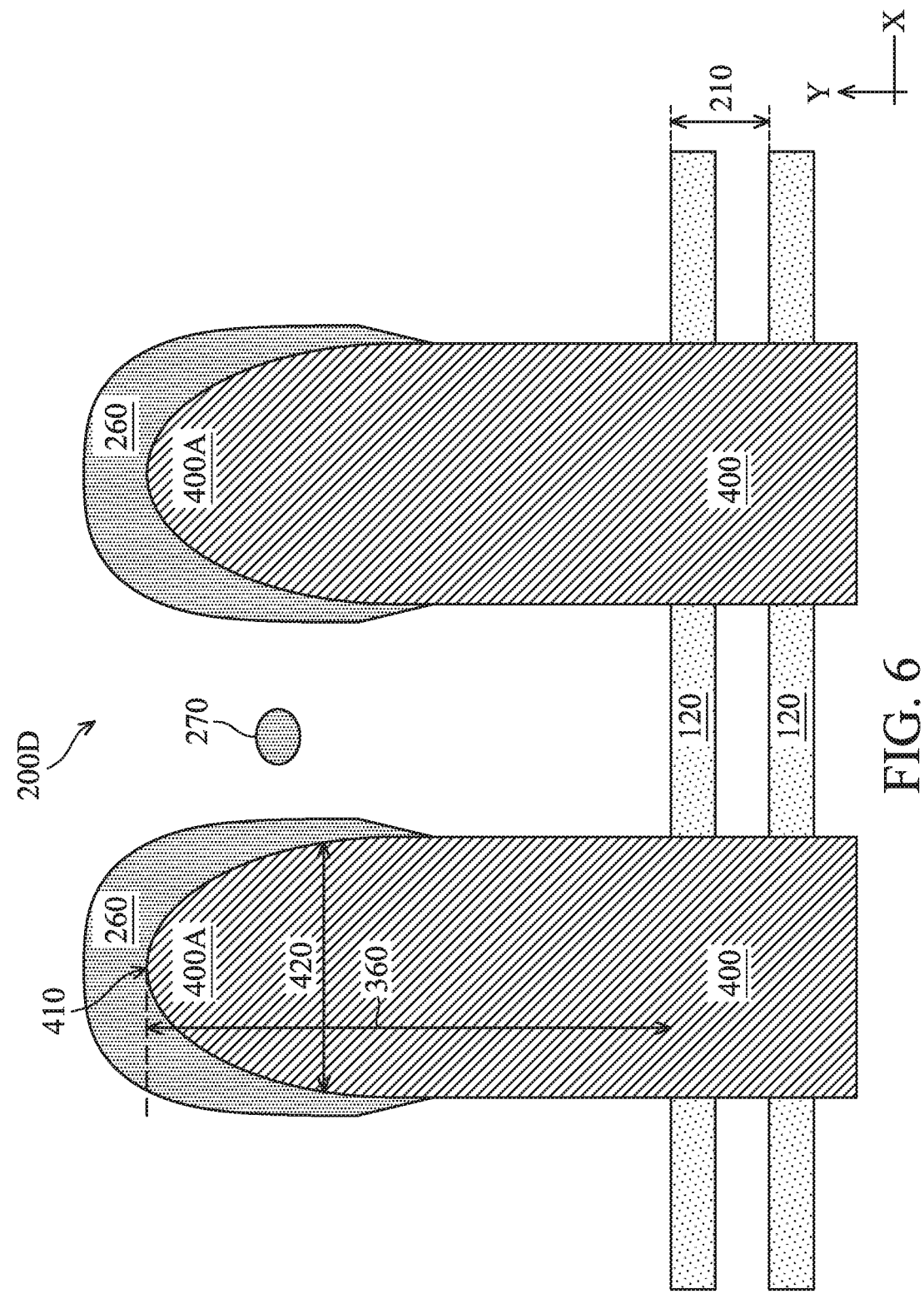

It is understood that in some embodiments, the characteristics of the embodiment of FIG. 4 (e.g., an inwardly tapered profile for the end segment of the gate) and the embodiment of FIG. 5 (e.g., a longer end segment of the gate) may be combined to implement the dummy gate structures. For example, FIG. 6 illustrates a diagrammatic fragmentary top view of an IC device 200D illustrating an optimized dummy gate shape profile according to an embodiment that combines elements of the embodiments of FIG. 4 and FIG. 5. For reasons of consistency and clarity, similar components appearing in FIGS. 2-6 will be labeled the same.

Referring to FIG. 6, the IC device 200D includes the fin structures 120 as well as a plurality of dummy gate structures 400 that are formed over and partially wrapped around the fin structures 120 in the manner similar to what is shown in FIG. 1A. The dummy gate structures 400 have end segments 400A that each have an inwardly tapered profile, similar to the embodiment shown in FIG. 4. For example, the dimension 420 of the end segment 400A shrinks the closer it gets to the tip 410 of the end segment 400A (e.g., as the end segment 400A extends farther beyond the closest fin structure 120). Meanwhile, the end segment 400A is also elongated or stretched out in a manner similar to the embodiment shown in FIG. 5. For example, a distance 430 between the tip 410 and the edge of the closest fin structure 120 is at least 4 times the pitch 210 associated with the fin structures 120. Due to these unique physical characteristics, the particles 270 are more easily removed during cleaning, and any remaining particles 270 (and their resulting HKMG-containing structures) are less likely to cause electrical shorting problems later.

Figure 7:
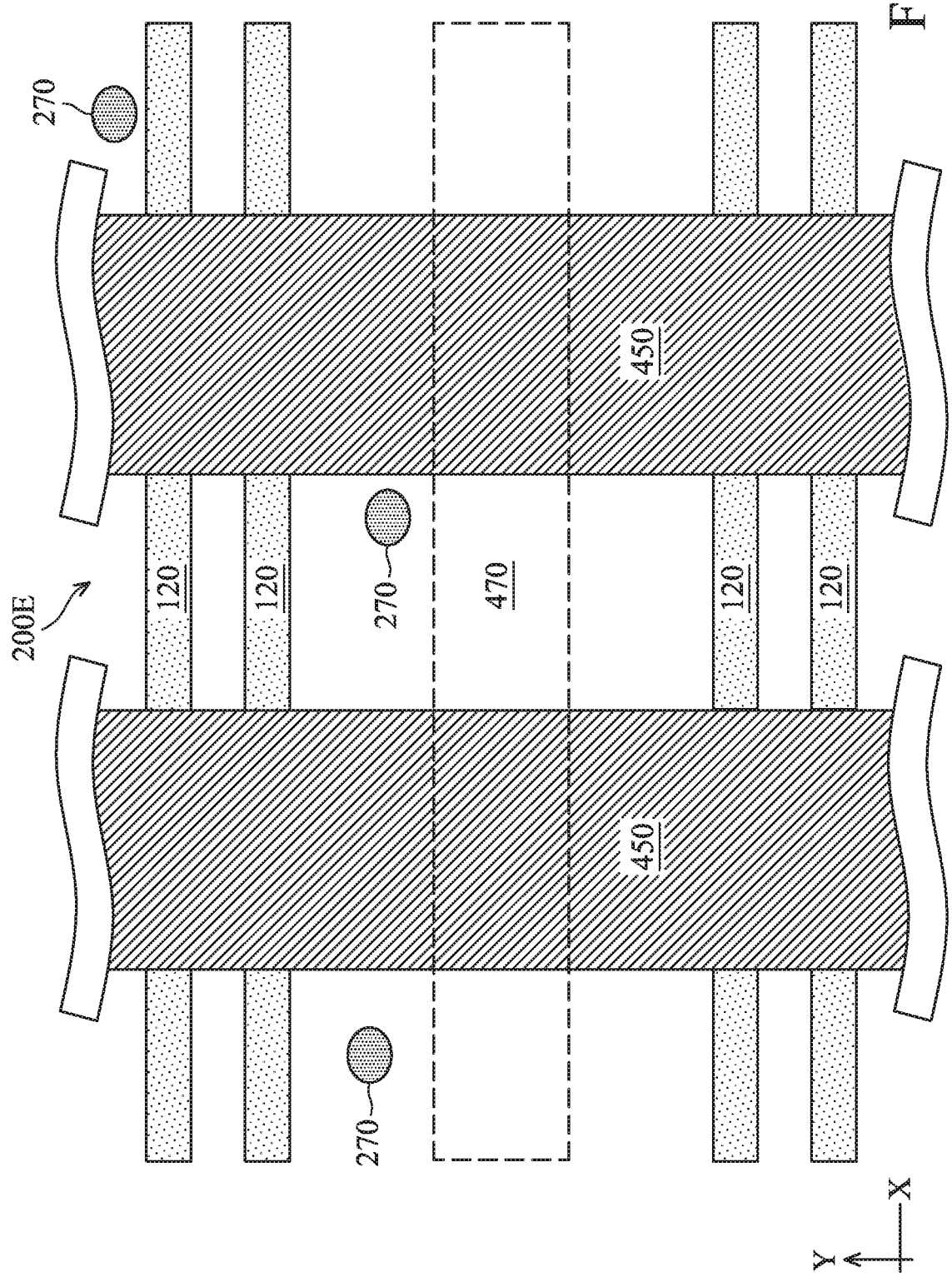

FIG. 7 illustrates a diagrammatic fragmentary top view of an IC device 200E illustrating an optimized dummy gate shape profile according to yet an embodiment. For reasons of consistency and clarity, similar components appearing in FIGS. 2-7 will be labeled the same. In FIG. 7, the IC device 200E includes the fin structures 120 as well as a plurality of dummy gate structures 450 that are formed over and partially wrapped around the fin structures 120 in the manner similar to what is shown in FIG. 1A. However, the dummy gate structures 450 lack the end segments of the dummy gate structures 240, 300, 350, and 400. In other words, the dummy gate structures 450 are each formed as a continuous dummy gate structure that extends along the Y-direction along the length of the die (e.g., a die of a wafer), rather than being formed as individual gate structures such as the dummy gate structures 240, 300, 350, and 400. However, due to space considerations, FIG. 7 may illustrate only a portion of each of the continuous dummy gate structures 450 in the Y-direction, though it is understood that the continuous dummy gate structures 450 may each extend beyond what is shown in FIG. 7.

Subsequently, after the HKMG structures are formed to replace the dummy gate structures 450, a dielectric structure 470 (also referred to as a cut-metal-gate or CMG feature) may be formed to divide the HKMG structures into individual HKMG gate structures. As such, the dummy gate structures do not have the end segments similar to the end segments 240A, 300A, 350A, or 400A, which reduces the likelihood of forming the particles 270. Even if the particles 270 are formed, they are still located farther away from the fin structures 120 and are more easily removed, thereby alleviating the electrical shorting problems discussed above. It is understood that the dielectric structure 470 are not formed yet at this stage of fabrication shown in FIG. 7, and it is included in FIG. 7 merely to indicate the locations at which the continuous gate structures may be "cut". As such, the borders/boundaries of the dielectric structure 470 are illustrated herein as dashed lines.

FIGS. 8-13 illustrate diagrammatic fragmentary top views of IC devices 200A, 200B, 200C, 200D, and 200E at a later stage of fabrication, for example after a gate replacement process have been performed to replace the dummy gate structures discussed above with HKMG structures. For example, an interlay dielectric (ILD) may be formed around the dummy gate structures discussed above. The dummy gate structures may be removed using etching processes, which leaves openings (trenches) in the ILD. These openings or trenches are subsequently filled by the metal gate electrodes of the HKMG structures. In some embodiments, if the dummy gate structures include a dummy gate dielectric layer (e.g., a silicon oxide gate dielectric), then the dummy gate dielectric layer will also be replaced by a high-k gate dielectric layer as a part of the KHMG structures.

Figure 8:
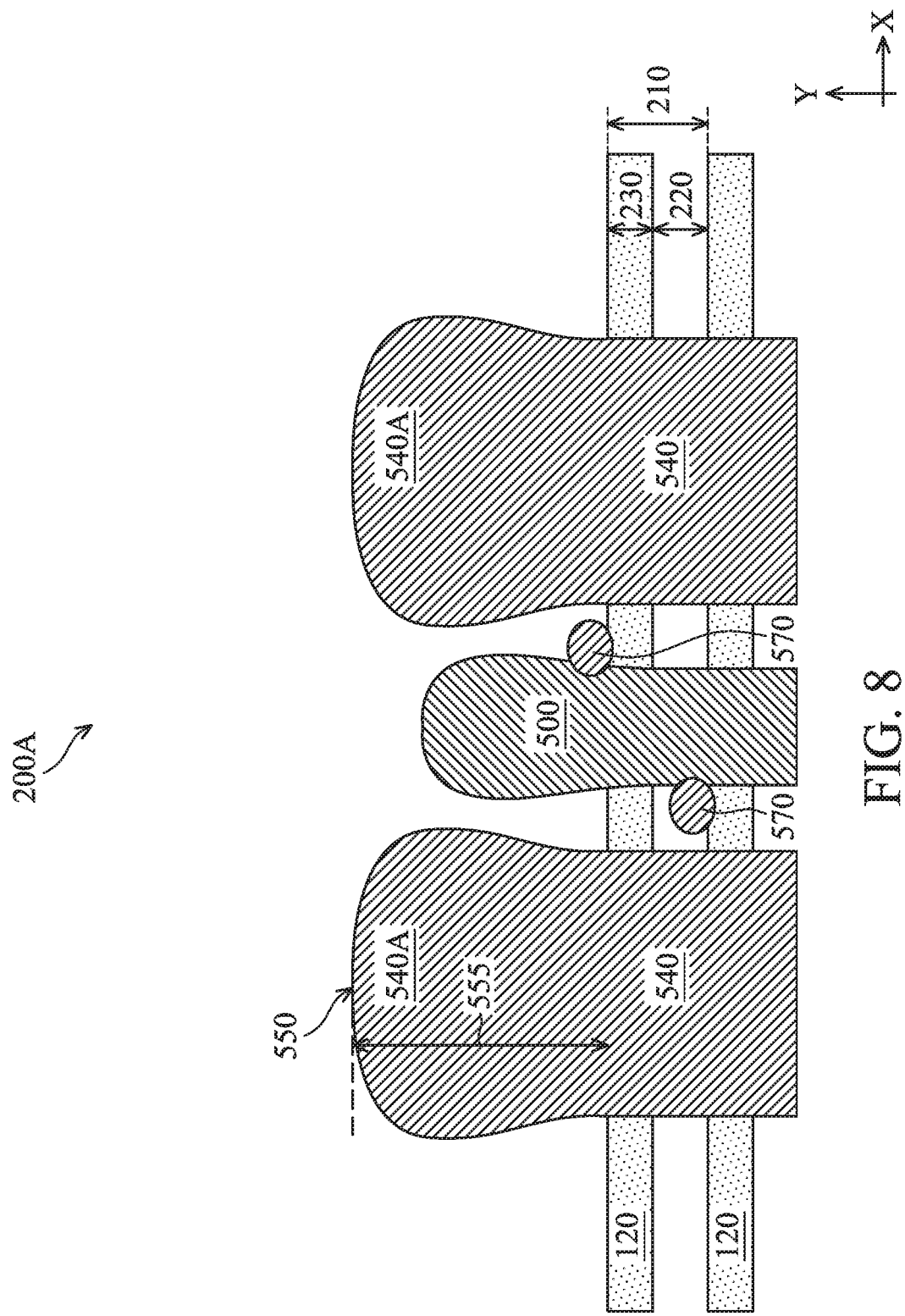
Figure 9:
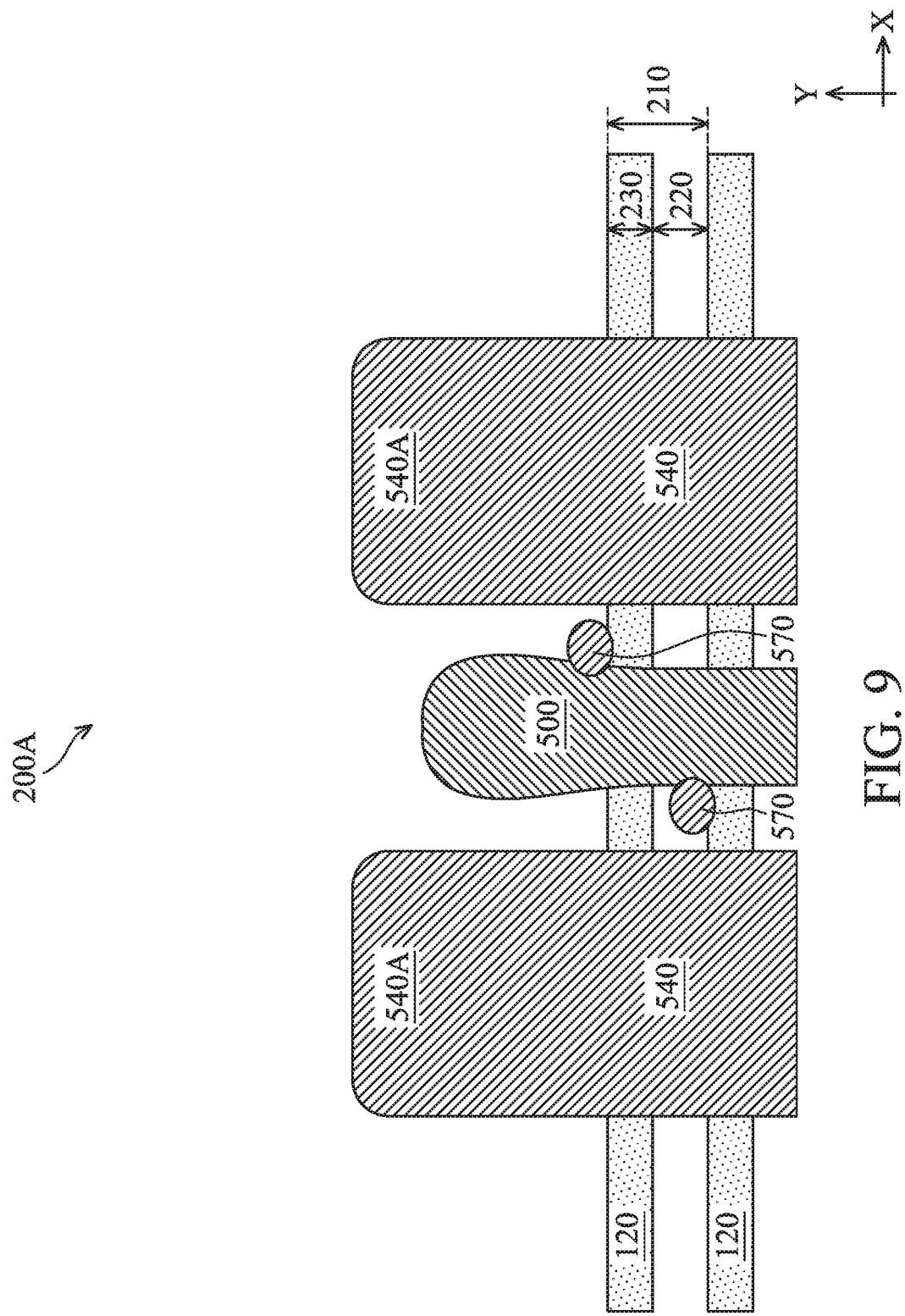

Referring to FIGS. 8-9, HKMG structures 540 are formed to replace the dummy gate structures 240. The HKMG structures 540 substantially inherit the top view shape or profile of the dummy gate structures 240. For example, the HKMG structures 540 may have end segments 540A that are outwardly protruding in the X-direction and/or the Y-direction, and a distance 555 between a tip 550 of the end segment 540A may be less than about 3 times the pitch 210 of the fin structures 120. In other words, the end segments 540A of the HKMG structures 540 are not inwardly tapered, and they are not elongated in the Y-direction.

A conductive source/drain contact 500 may be formed between the HKMG structures 540. The conductive source/drain contact 500 provides electrical connectivity to source/drain features below. Had the particles 270 discussed above not been removed and are subsequently transformed into the HKMG-containing structures, such as structures 570, they may cause electrical shorting with the conductive source/drain contacts 500, which may lead to inadequate device performance or device defects, for example with respect to breakdown voltage (VBD).

Figure 10:
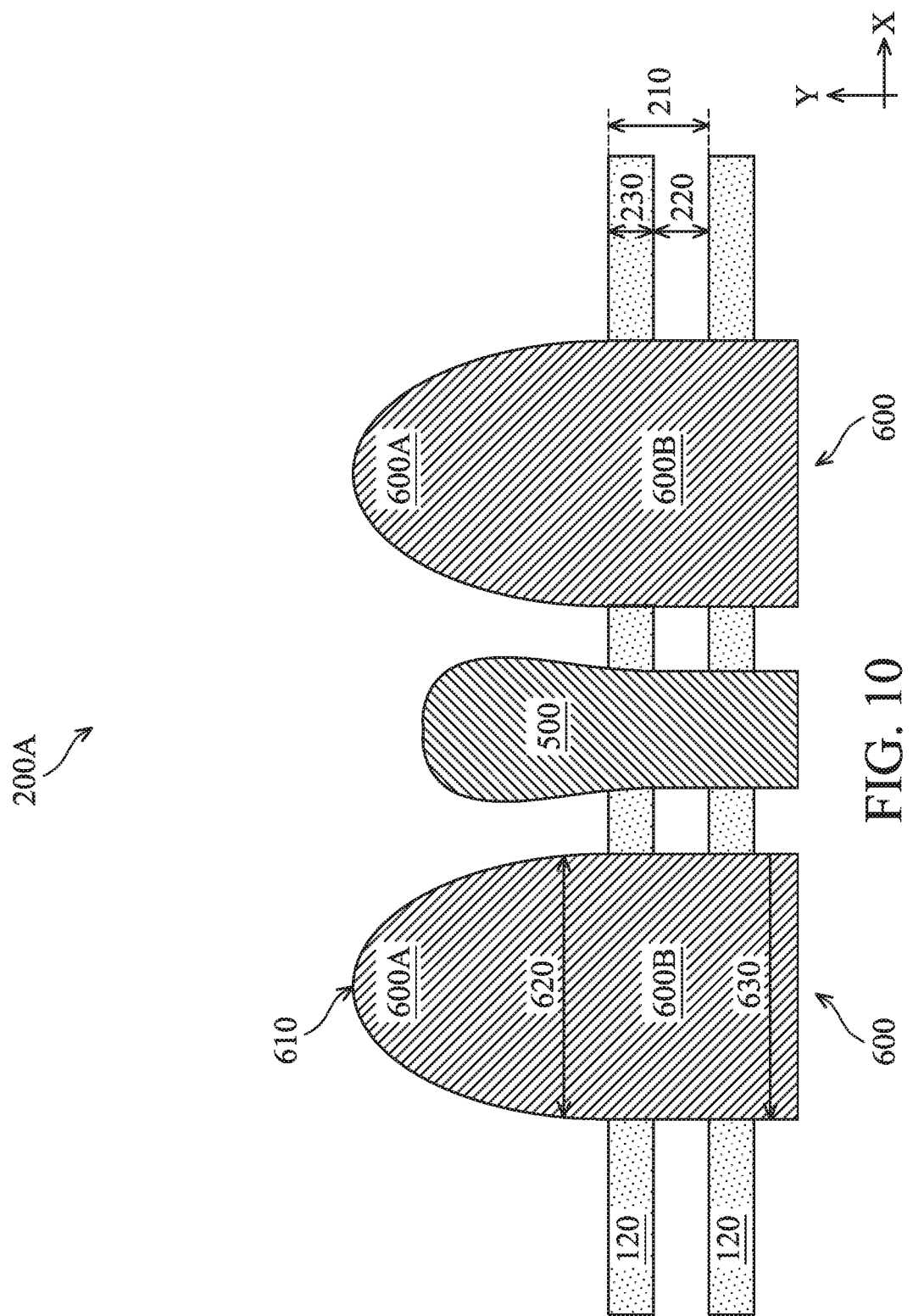

Referring now to FIG. 10, HKMG structures 600 are formed to replace the dummy gate structures 300. The HKMG structures 600 substantially inherit the top view shape or profile of the dummy gate structures 300. As such, the HKMG structures 600 may have end segments 600A that are inwardly tapered like the end segments 300A. For example, the end segment 600A may have a dimension 620 (measured in the X-direction) that shrinks the closer it gets to the tip 610 of the end segment 600A (e.g., the farther the end segment 600A extends beyond the edge of the closest fin structure 120), whereas a dimension 630 of the body segment 600B stays relatively the same throughout the body. As discussed above, the shrinking of the end segment 600A helps the removal of the particles 270 during the cleaning performed after the definition of the dummy gate structures 300, as well as reducing the likelihood of electrical shorting caused by HKMG-containing structures corresponding to any particles 270 that remain after the cleaning. As such, there is a lower likelihood of electrical shorting with the conductive source/drain contact 500. In some embodiments, there are no remaining particles 270 trapped between the fin structures 120 by the time the gate replacement process is performed, which means that there is no formation of undesirable HKMG-containing structures between the fin structures 120, which could have electrically shorted with the conductive source/drain contact 500.

Figure 11:
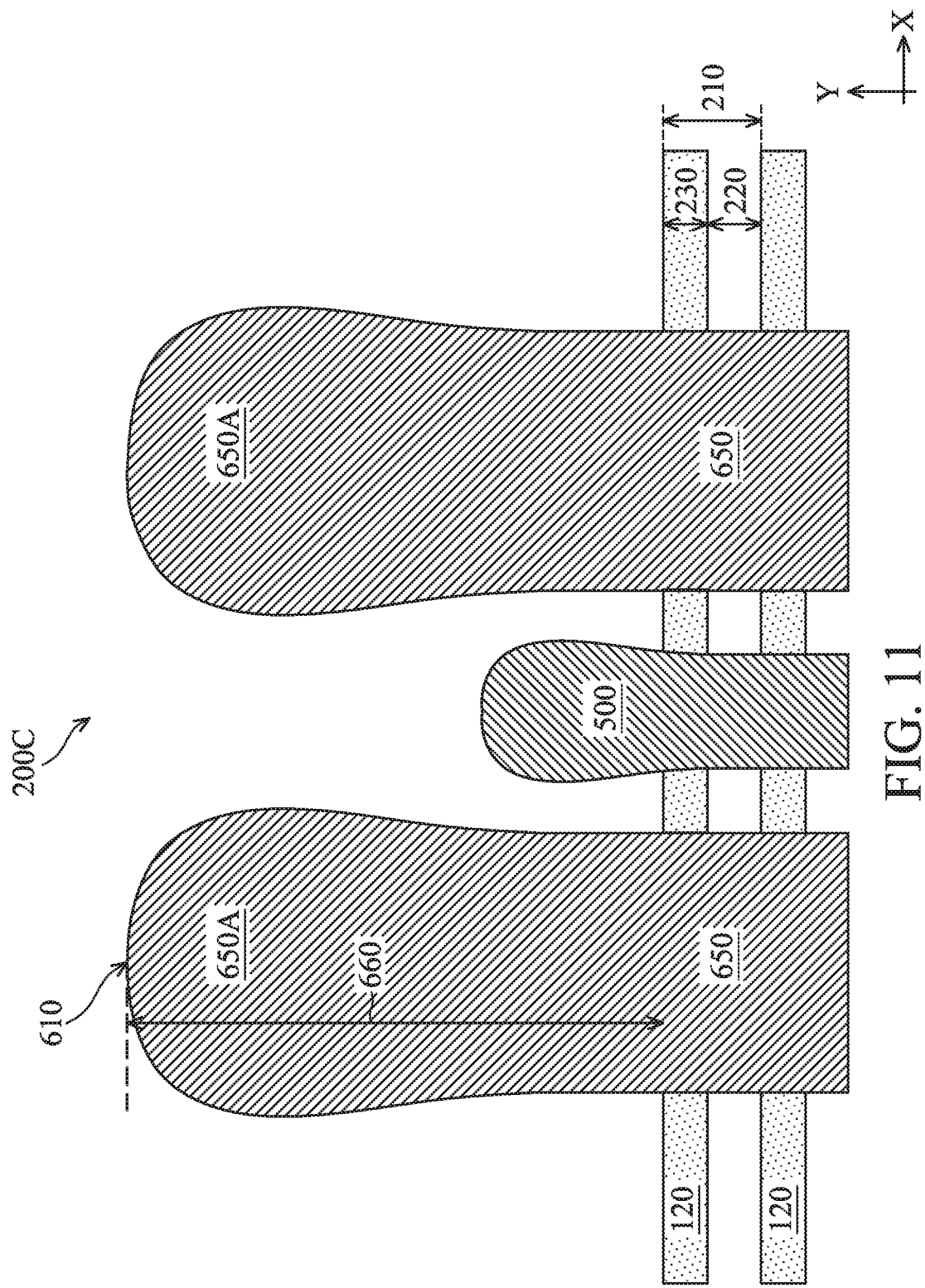

Referring now to FIG. 11, HKMG structures 650 are formed to replace the dummy gate structures 350. The HKMG structures 650 substantially inherit the top view shape or profile of the dummy gate structures 350. As such, the HKMG structures 650 may have end segments 650A that are stretched out or elongated in the Y-direction. For example, a tip 610 of the end segment 650A and an edge of the nearest fin structure 120 is separated by a distance 660. The distance 660 is similar in value to the distance 360. In some embodiments, the distance 660 is at least 4 times as long as the pitch 210 of the fin structures 120. For example, the distance 660 may be between about 4 times and about 8 times as long as the pitch 210. As discussed above, the elongation of the end segment 650A helps the removal of the particles 270 during the cleaning performed after the definition of the dummy gate structures 350, as well as reducing the likelihood of electrical shorting caused by HKMG-containing structures corresponding to any particles 270 that remain after the cleaning. As such, there is a lower likelihood of electrical shorting with the conductive source/drain contact 500.

Figure 12:
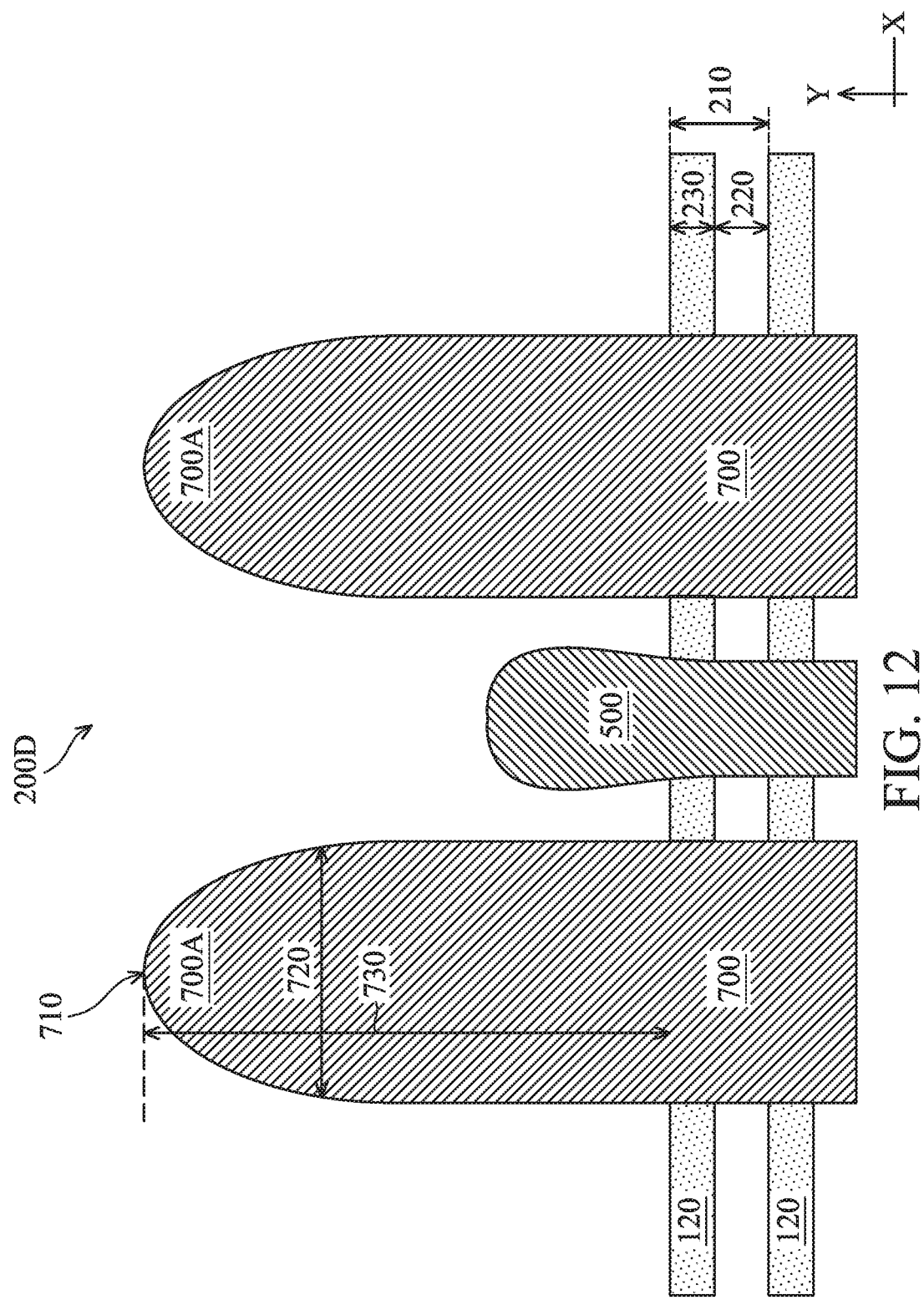

Referring now to FIG. 12, HKMG structures 700 are formed to replace the dummy gate structures 400. The HKMG structures 700 substantially inherit the top view shape or profile of the dummy gate structures 400. As such, the HKMG structures 700 may have end segments 700A that each have an inwardly tapered profile and are stretched out or elongated in the Y-direction. For example, a dimension 720 (measured in the X-direction) of the end segment 700A shrinks the closer it gets to the tip 710 of the end segment 700A. Meanwhile, the distance 730 between the tip 610 and the nearest fin structure 120 is at least 4 times as long as the pitch 210 of the fin structures 120. For example, the distance 730 may be between about 4 times and about 8 times as long as the pitch 210. As discussed above, the inwardly tapered profile and the elongation of the end segment 700A helps the removal of the particles 270 during the cleaning performed after the definition of the dummy gate structures 400, as well as reducing the likelihood of electrical shorting caused by HKMG-containing structures corresponding to any particles 270 that remain after the cleaning. As such, there is a lower likelihood of electrical shorting with the conductive source/drain contact 500.

Figure 13:
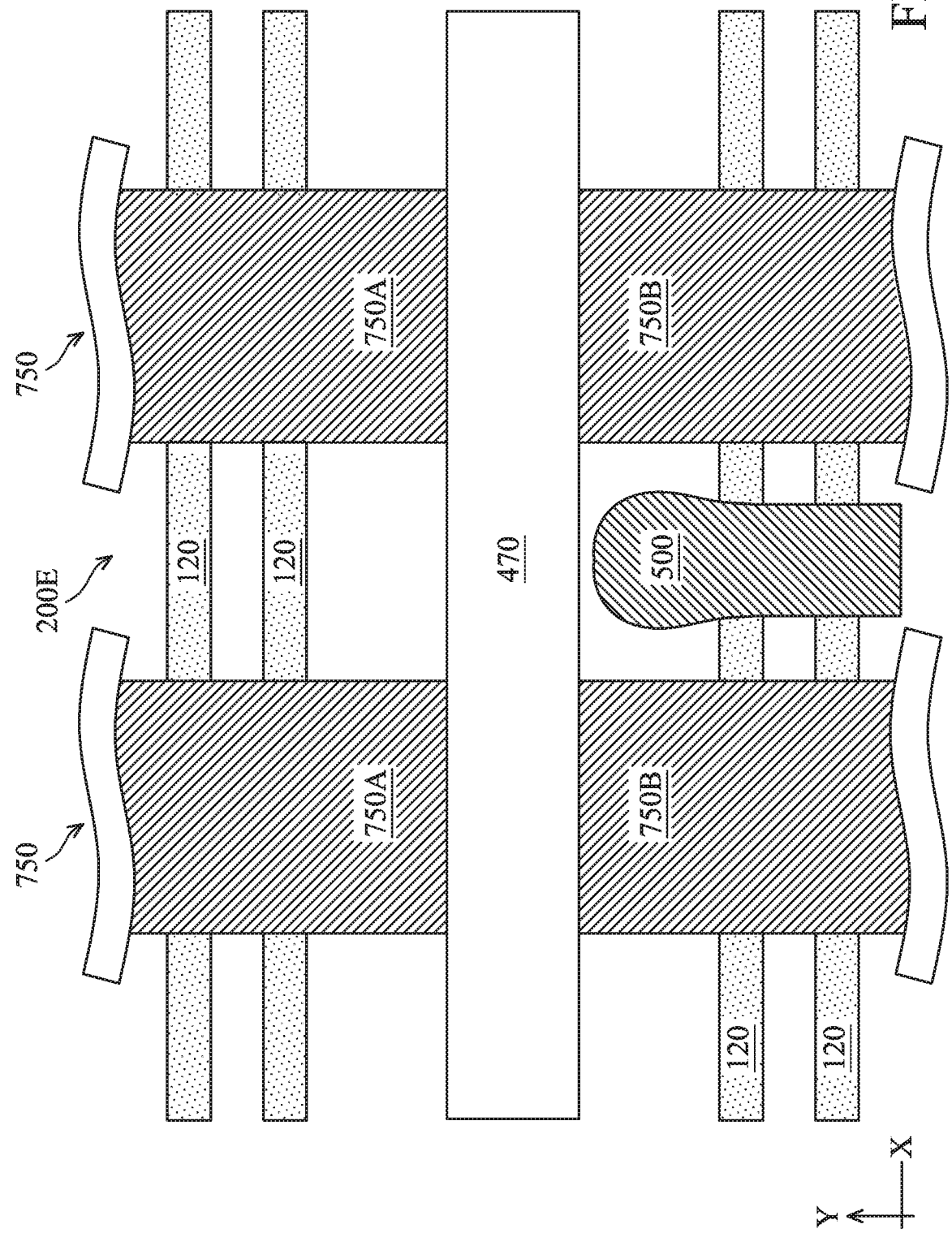

Referring now to FIG. 13, HKMG structures 750 are formed to replace the dummy gate structures 450. The HKMG structures 750 substantially inherit the top view shape or profile of the dummy gate structures 450. As such, the HKMG structures 750 may lack the end segments similar to the end segments 540A, 600A, 650A, or 700A, since the HKMG structures 750 may be formed as a continuous structure that extends through the length of the die in the Y-direction. For space considerations, FIG. 13 may only illustrate a portion of the HKMG structures 750, and it is understood that the HKMG structures 750 may each extend beyond what is shown in FIG. 13. The dielectric structures 470 discussed above (e.g., CMG features) are formed to divide each of the continuous HKMG structures 750 into separate gate structures 750A and 750B. As discussed above, such a process generates fewer particles 270, makes any potentially generated particles 270 more easily removable, and/or also reduces the likelihood of electrical shorting between the conductive source/drain contact 500 with any HKMG-containing structures formed corresponding to the particles 270.

Figure 14:
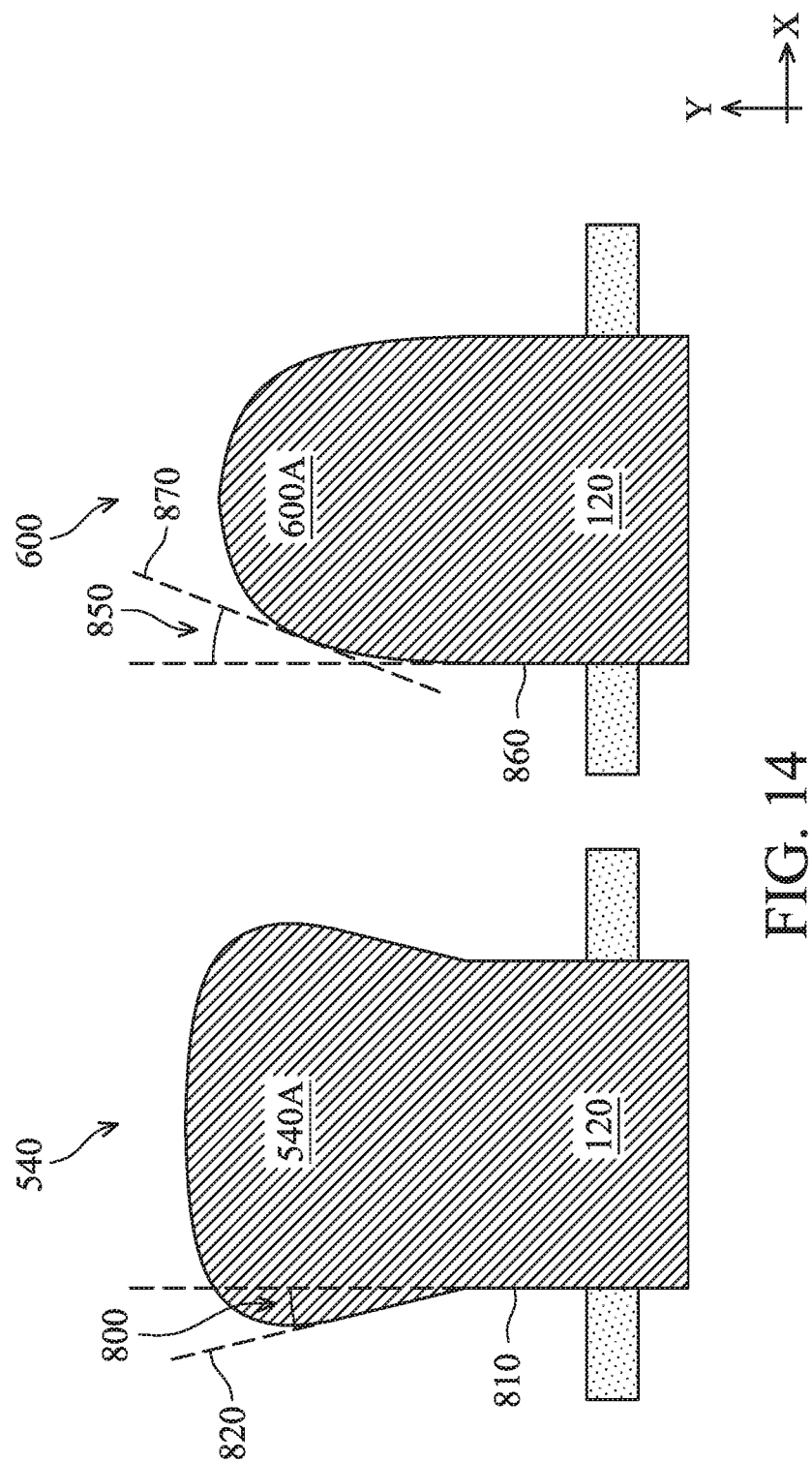

FIG. 14 is a diagrammatic fragmentary top view of HKMG structures 540 and 600A that illustrates the difference between their curvatures. For example, the end segment 540A of the HKMG structure 540 has an outwardly protruding profile, which may be measured at least in part by an angle 800. The angle 800 may be defined by a substantially straight (e.g., extending substantially in the Y-direction) edge 810 of the HKMG structure 540 and a tangent line 820 that is taken as a tangent along the outwardly curved portion of the end segment 540A. The angle 800 is greater than 0. In some embodiments, the angle 800 is in a range between about 1 degree and about 30 degrees.

In comparison, the end segment 600A of the HKMG structure 600 has an inwardly tapered profile, which may be measured at least in part by an angle 850. The angle 850 may be defined by a substantially straight (e.g., extending substantially in the Y-direction) edge 860 of the HKMG structure 600 and a tangent line 870 that is taken as a tangent along the inwardly tapered portion of the end segment 600A. The angle 850 is less than 0. In some embodiments, the angle 850 is in a range between about −1 degree and about −30 degrees. The above range is not randomly chosen but specifically configured to ensure that the end segment 600A is sufficiently tapered to facilitate the easy removal of the undesirable particles 270, while also ensuring that the end segment 600A is not too thin or too tapered such that the functionality of the gate would be adversely affected. It is understood that the end segment 700A of the HKMG structure 700 may also have such an angle 850 having similar value ranges.

Figure 15:
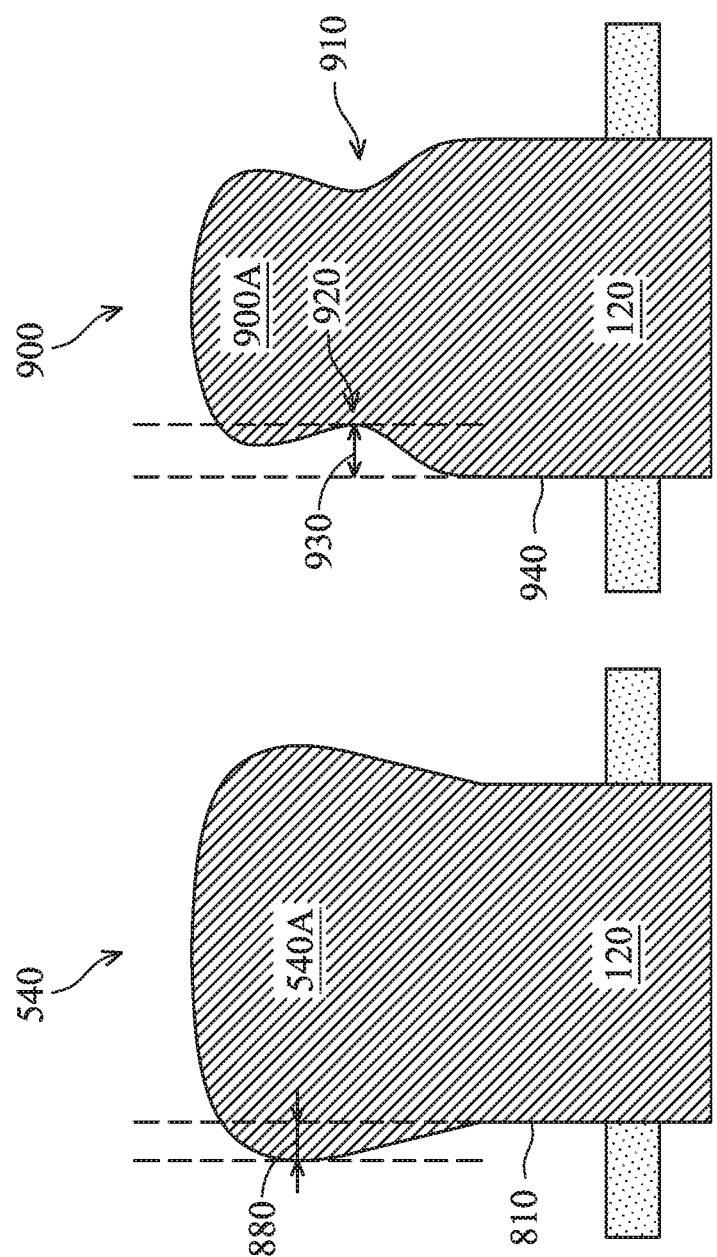

FIG. 15 is a diagrammatic fragmentary top view of the HKMG structure 540 and another HKMG structure 900 formed according to an embodiment of the present disclosure. For the HKMG structure 540, a distance 880 separates the edge 810 from its outermost protruding point of the end segment 540A. The distance 880 is greater than 0. In some embodiments, the distance 880 is in a range between about 1 nanometer (nm) and about 20 nm. In comparison, the HKMG structure 900 may have an end segment 900A that is overall thinner than the body of the HKMG structure 900 in the X-direction. The end segment 900A also has a concave portion 910 that curves inwardly. For example, the end segment 900A curves inward the most at a point 920. Due to such an inward curvature, a distance 930 separates the point 920 and an edge 940 of the HKMG structure 900, where the edge 940 extends substantially straight in the Y-direction. The distance 930 is in a range between about 1 nm and about 30 nm.

Figure 21A:
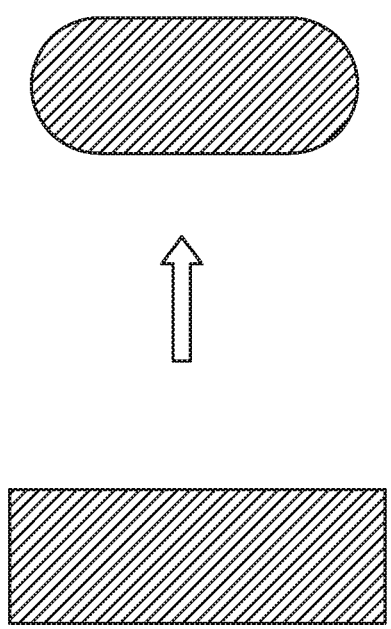
FIGS. 21A and 21B illustrate the top view profiles of different patterns on a lithography mask and their corresponding patterns on the wafer.
Figure 21B:
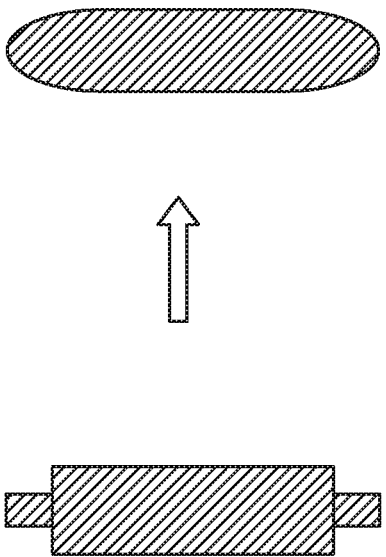

It is understood that although FIGS. 14-15 illustrate the top view profiles of the various HKMG structures that have been actually formed on a wafer, they may correspond to (e.g., resemble) the top view profiles of mask patterns on a lithography mask as well. For example, the mask pattern on a lithography mask used to define the HKMG structure 600 may also have the shape/profile similar to that shown in FIG. 14. Some minor differences between the shape/profile of the HKMG structures and the mask patterns on the lithography mask may be that the mask patterns may be thinner (e.g., in the X-direction) and/or longer (e.g., in the Y-direction) than their corresponding HKMG structures. In addition, the end portions of the patterns on the lithography mask may be modified (e.g., by adding OPC assist features) to achieve a desired shape/profile for the pattern formed on the actual wafer. In that regard, FIGS. 21A and 21B illustrate several examples of the relationship between different patterns on the lithography mask and their corresponding patterns on the wafer. For example, FIG. 21A illustrates how a rectangular pattern on a lithography mask may form a pattern with rounded end portions on a wafer. FIG. 21B illustrates how a rectangular main pattern with smaller assist features appended to its end portions may form a pattern with more tapered end portions (e.g., tapered according to aspects of the present disclosure) on the wafer. As such, it can be seen how the patterns on a lithography mask may be configured, manipulated, or otherwise adjusted to achieve the gate structures with the specific profiles (e.g., tapered and/or elongated end portions) according to the embodiments of the present disclosure.

Figure 16:
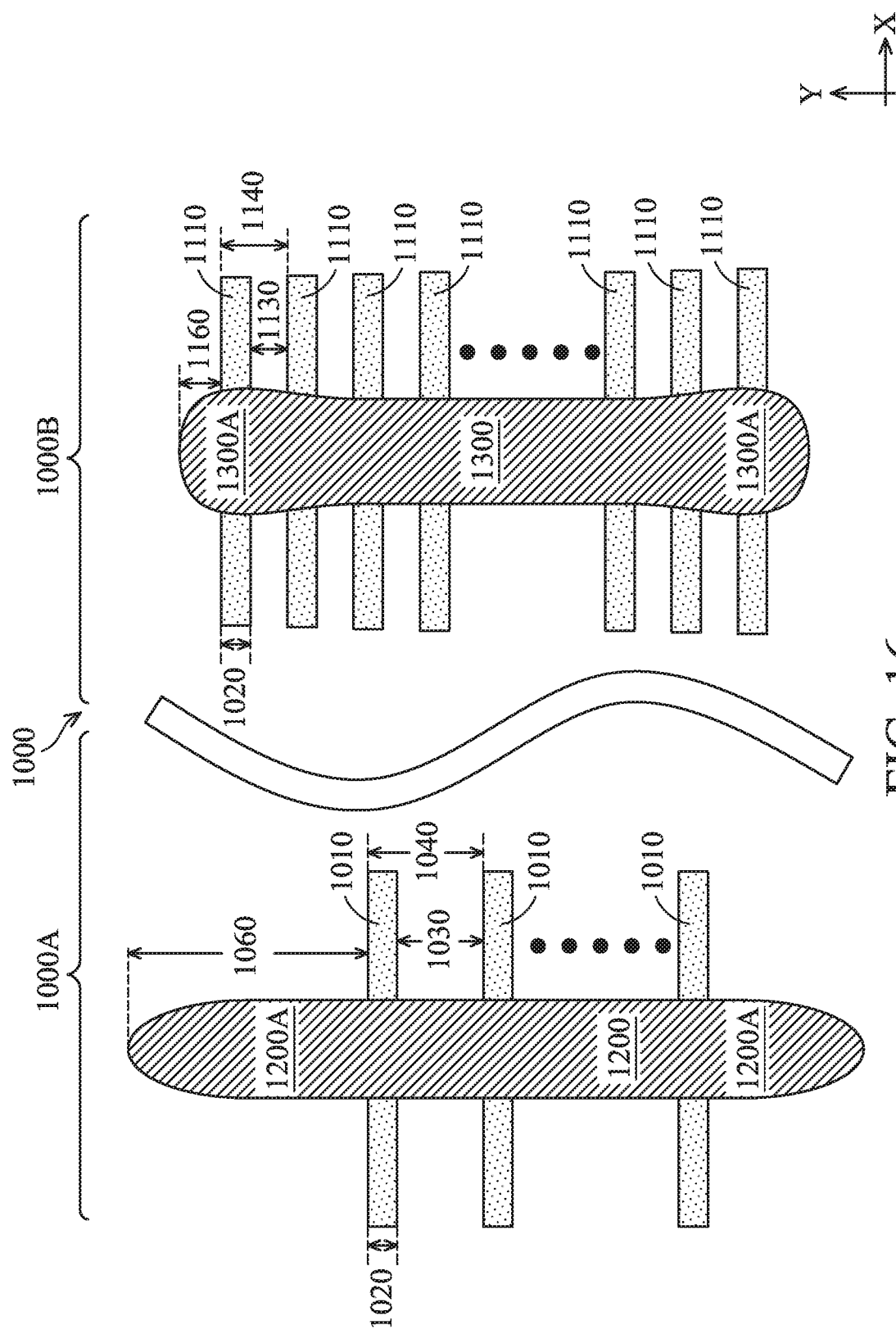

According to some aspects of the present disclosure, gate structures with different shapes or profiles may be fabricated on the same wafer. For example, referring to FIG. 16, a diagrammatic fragmentary top view of different portions of a wafer 1000 is illustrated. The wafer 1000 may include may regions, for example regions 1000A and 1000B. Active regions such as fin structures may be formed in both region 1000A and region 1000B. For example, a plurality of fin structures 1010 may be formed in the wafer region 1000A, while a plurality of fin structures 1110 may be formed in the wafer region 1000B. The fin structures 1010 and 1110 may be similar to the fin structures 120 discussed above, for example they may be formed as semiconductor-containing structures that protrude vertically upwards out of a substrate. The fin structures 1010 and 1110 each extend in the X-direction and have widths 1020 and 1120, respectively, that are measured in the Y-direction. In some embodiments, the widths 1020 and 1120 may be substantially equal to one another. In other embodiments, the widths 1020 and 1120 may have different values. It is understood that only a subset of the fin structures 1010 and 1110 are illustrated in FIG. 16 due to space considerations.

The wafer region 1000A and the wafer region 1000B have different pattern densities. For example, a distance 1030 separates adjacent pairs of fin structures 1010, while a distance 1130 separates adjacent pairs of fin structures 1110. As shown in FIG. 16, the distance 1030 is substantially longer than the distance 1130. In some embodiments, a ratio between the distance 1030 and the distance 1130 is in a range between about 1.6 and about 2.0. Due at least in part to the different distances 1030 and 1130, the wafer regions 1000A and 1000B may have substantially different fin pitches 1040 and 1140 as well, respectively. In some embodiments, a ratio between the fin pitch 1040 and the fin pitch 1140 is in a range between about 1.8 and about 2.3.

The differences in pattern densities between the wafer regions 1000A and 1000B may be due to design or fabrication requirements. For example, certain types of IC devices may need a greater pattern density (e.g., more closely packed fin structures), while other types of IC devices may need a lower pattern density (e.g., farther spaced-apart fin structures).

Due to the differences in pattern densities, the wafer region 1000A and the wafer region 1000B may implement gate structures having different end segment profiles. In more detail, a gate structure 1200 may be implemented in the wafer region 1000A, while a gate structure 1300 may be implemented in the wafer region 1000B. The gate structures 1200 and 1300 may each extend in the Y-direction and may be wrapped around the fin structures 1010 and 1110, respectively. The gate structures 1200 and 1300 may be HKMG structures in some embodiments.

The lower fin pattern density of the wafer region 1000A means that the undesirable particles 270 are more likely to be generated. In more detail, during the etching of the dummy gate layer to define the dummy gate structures, the etching may stop when the fin structures 1010 underneath are reached. The lower fin pattern density of the wafer region 1000A means that a greater amount of the dummy gate layer material needs to be etched away, thereby giving a greater opportunity for the particles 270 to be generated. Hence, the gate structure 1200 may be implemented similar to the HKMG structure 600 of FIG. 10 or to the HKMG structure 650 of FIG. 11, or to the HKMG structure 700 of FIG. 12 (e.g., as a combination of the HKMG structures 600 and 650). In other words, the gate structure 1200 may be implemented to have end segments 1200A that are inwardly tapered, or have end segments 1200A that extend beyond the outermost fin structure 1010 by a distance 1060 that is at least 4 times as long as the fin pitch 1040 (note that FIG. 16 is not drawn in scale). Again, the fact that the end segment 1200A has an inwardly tapered profile and/or is stretched out in the Y-direction allows the undesirable particles 270 to be generated farther away from the fin structures 1010, which makes them easier to remove during a cleaning process (e.g., by suction forces).

On the other hand, the greater pattern density of the wafer region 1000B means that the undesirable particles 270 are less likely to be generated, since the greater presence of the fin structures 1110 underneath the dummy gate layer means that not as much of the dummy gate layer material needs to be etched away. Hence, the gate structures 1300 need not be optimized in the manner similar to the gate structure 1200. In the illustrated embodiment, the gate structure 1300 may be shaped similar to the HKMG structure 540 of FIG. 8. For example, the gate structure 1300 may have end segments 1300A that are shaped similar to the end segment 540A as shown in FIG. 8 or FIG. 9, which may have an outwardly protruding profile or a rectangular profile with rounded corners. The end segment 1300A also need not be as stretched out as the end segment 1200A. For example, the end segment 1300A may protrude beyond the outermost fin structure 1110 by a distance 1160 in the Y-direction, where a ratio between the distance 1160 and the fin pitch 1140 may be less than about 3. In some embodiments, the distance 1060 is also substantially greater than the distance 1160. For example, a ratio between the distance 1060 and the distance 1160 may be in a range between about 2.0 and about 4.0. Again, the difference in value between the distances 1060 and 1160 is not a random result, but is due to the profile of the gate structure 1200 being specifically configured according to the aspects of the present disclosure.

Figure 17:
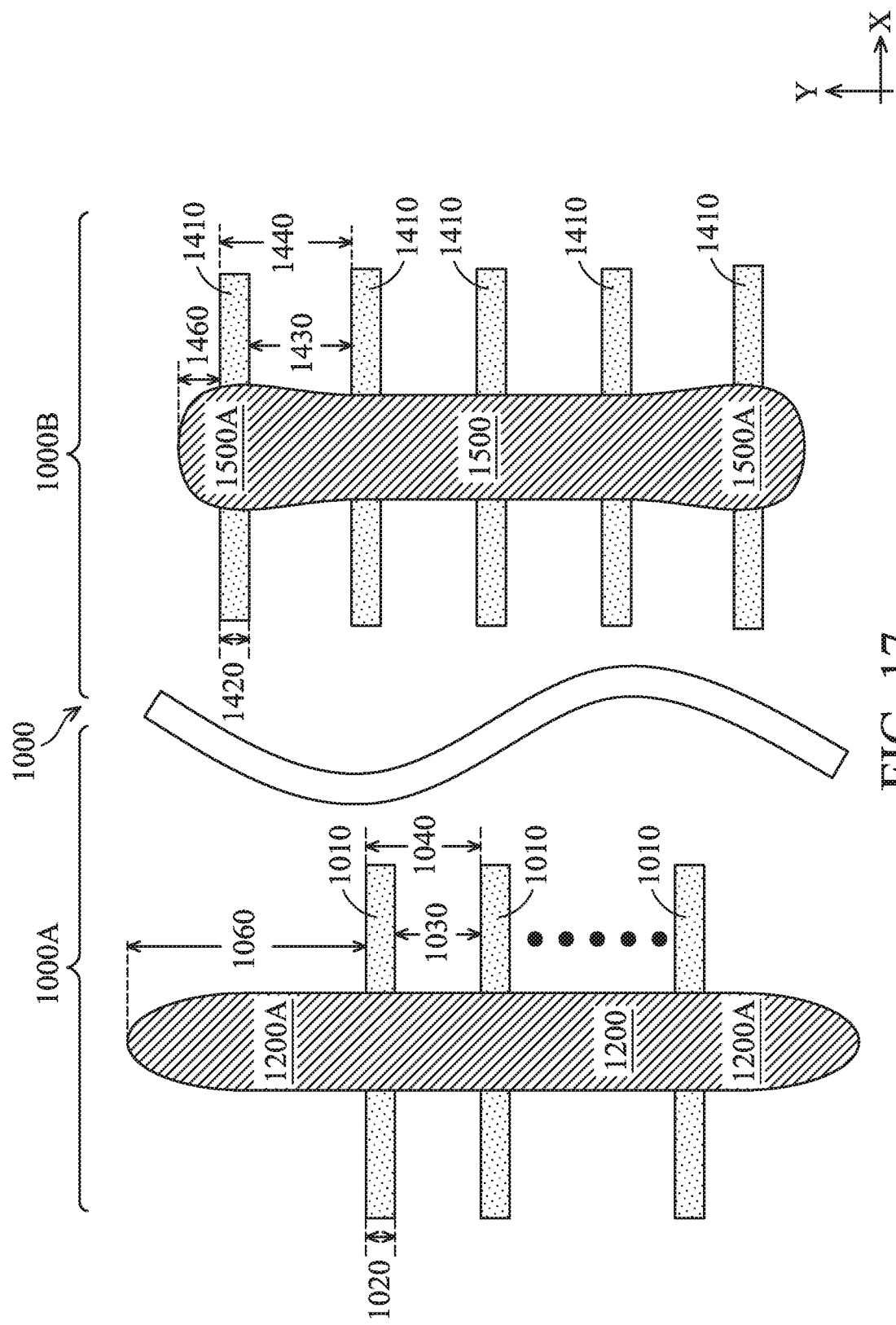

FIG. 17 illustrates a diagrammatic fragmentary top view of different portions of the wafer 1000 according to some other aspects of the present disclosure. For reasons of clarity and consistency, similar components appearing in FIGS. 16-17 will be labeled the same. For example, FIG. 17 also illustrates the wafer region 1000A, where the gate structure 1200 is formed according to the present disclosure. As discussed above, the gate structure 1200 has an optimized profile, in that its end segment 1200A is tapered and elongated in the Y-direction.

FIG. 17 also illustrates a wafer region 1000C, which includes a plurality of active regions 1410. Note that the wafer region 100C may or may not be on the same wafer or on the same die as the wafer region 100A. In some embodiments, the active regions 1410 are non-fin structures. For example, the active regions 1410 may be the active regions for planar devices. In other words, the active regions 1410 may include semiconductor regions (portions of which may be doped) that are embedded in a substrate and do not protrude vertically out of the substrate. As discussed above, planar devices may not have the problems associated with the particles 270, since there are no vertically protruding fin structures to trap the particles 270. Therefore, the gate structure 1500 that is formed over the active regions 1410 need not optimize its profile. For example, the gate structure 1500 may include end segments 1500A that are shaped similar to the end segment 1300A of FIG. 16 (or similar to the end segment 540A as shown in FIG. 8 or FIG. 9), which may have an outwardly protruding profile or a rectangular profile with rounded corners.

The end segment 1500A also need not be as stretched out as the end segment 1200A. For example, the end segment 1500A may extend beyond the edge of an outermost active region 1410 by a distance 1460, which is less than 3 times the pitch 1440 of the active regions 1410, where the pitch 1440 is equal to the sum of: a dimension 1420 of the active region 1410 and a distance 1430 between an adjacent pair of the active regions 1410. In other words, for planar devices (e.g., devices that do not have the vertically protruding fin structures), the undesired particles 270 are much less likely to become trapped, meaning they would not have become an issue even for at the gate ends. The problems associated with the undesired particles 270 are problems that uniquely arise in the context of FinFETs (including gate-all-around devices). Therefore, it would not have been obvious for planar devices to implement gate structures with tapered or elongated end portions like the present disclosure, because it would have been unnecessary for planar devices to do so.

Another aspect of the present disclosure involves revising an IC layout plan to optimize the shape or profile of the gate structures. In that regard, modern semiconductor fabrication may involve a foundry that receives an original IC layout plan from a fabless IC design house, where the fabless IC design house generated the original IC layout plan. The original IC layout plan typically contains patterns that are shaped as rectangles, squares, or other polygons having substantially straight edges and 90-degree corners. These patterns may be modified by the foundry to facilitate fabrication. For example, optical proximity correction (OPC) patterns may be added to the original IC layout plan to achieve desired device pattern shapes and/or sizes. According to the various aspects of the present disclosure, the gate patterns in the original IC layout may be optimized to have tapered end segments, as well as being stretched or elongated.

Figure 18:
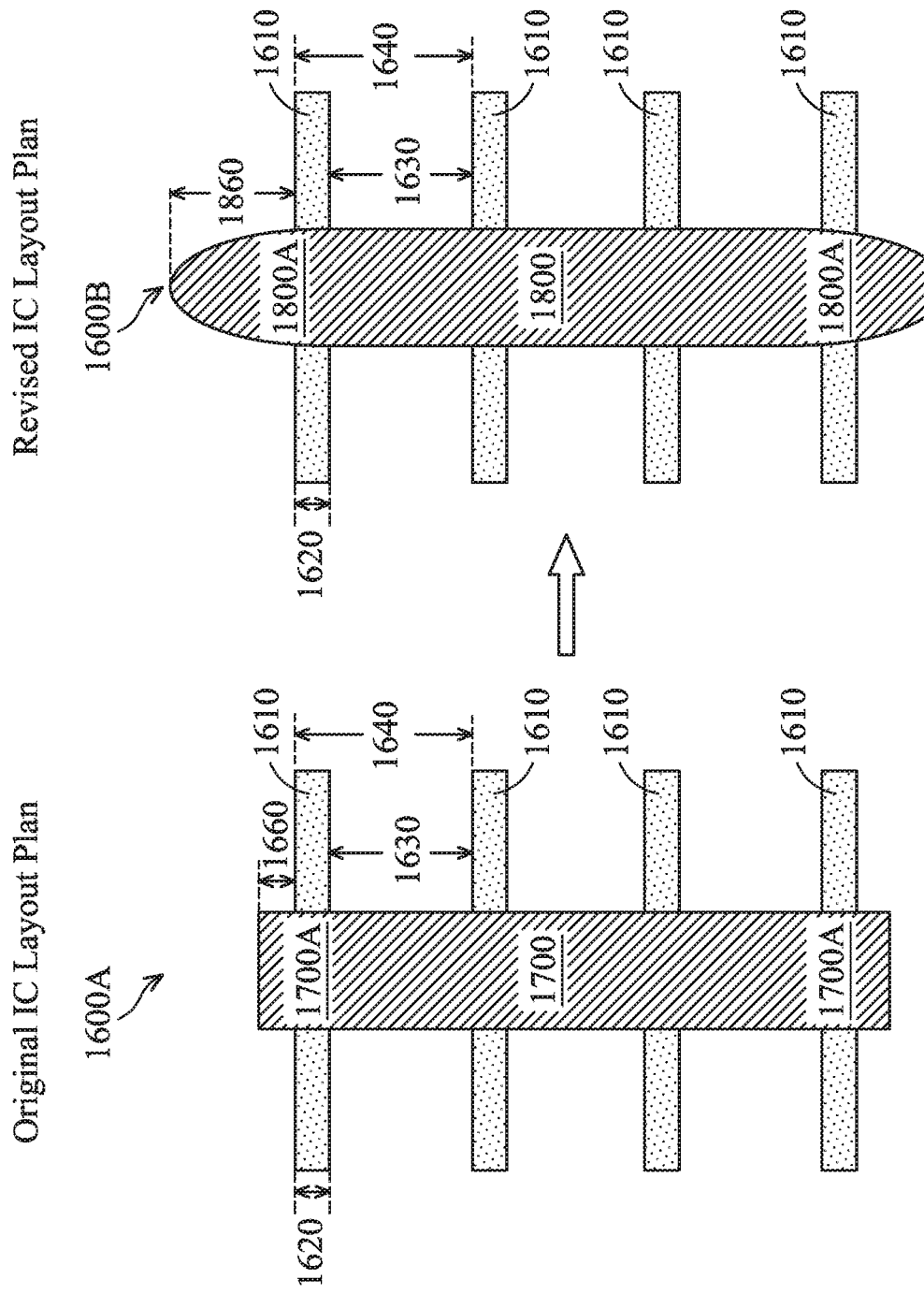

As example of such a modification of the original IC layout plan is shown in FIG. 18, which illustrates the top views of a portion of an original IC layout plan 1600A and the corresponding revised IC layout plan 1600B. The original IC layout plan 1600A includes a plurality of active regions, for example fin structure patterns 1610 that extend in the X-direction. The fin structure patterns 1610 each have a dimension 1620 measured in the Y-direction, and a distance 1630 separates the adjacent fin structure patterns 1610. A fin pitch 1640 of the fin structure patterns 1610 is equal to a sum of: the dimension 1620 and the distance 1630.

A gate structure pattern 1700 overlaps with the fin structure patterns 1610 in the top view and extends in the Y-direction. The gate structure pattern 1700 has end segments 1700A that each extend beyond the boundaries of the outermost fin structure patterns 1610 by a distance 1660 in the Y-direction. As shown in FIG. 18, the fin structure patterns 1610 and the gate structure pattern 1700 may each be shaped as a rectangle. As discussed above, if such an IC layout plan is transferred to a lithography mask, the resulting gate pattern on an actually fabricated wafer may have end segments that protrude outward, for example in a manner similar to the end segment 540A (see FIG. 15). As discussed above, this may be undesirable, since it may generate the particles 270 that may be too close to the fin structures corresponding to the fin structure patterns 1610, which may lead to electrical shorting later.

The present disclosure solves this problem by generating the revised IC layout plan 1600B based on the original IC layout plan 1600A. The revised IC layout plan 1600B may or may not modify the fin structure patterns 1610, but the gate structure pattern 1700 is revised into a gate structure pattern 1800. In some embodiments, the gate structure pattern 1800 may be generated to have end segments 1800A that are tapered inwardly, for example similar to the gate structure 1200 discussed above (see FIGS. 16-17).

In some embodiments, in addition to (or instead of) tapering the end segments 1800A, the gate structure pattern 1800 is also stretched out or elongated in the Y-direction. For example, whereas the gate structure pattern 1700 extends beyond the outermost fin structure 1610 by a distance 1660 according to the original IC layout plan, the gate structure pattern 1800 extends beyond the outermost fin structure 1610 by a distance 1860 according to the revised IC layout plan, where the distance 1860 is substantially greater than the distance 1660. In some embodiments, the distance 1860 is stretched to be at least 4 times as long as the fin pitch 1640. In some embodiments, a ratio between the distance 1860 and the distance 1660 is in a range between about 2.0 and about 4.0. The above range is not randomly chosen but specifically configured such that the gate structure fabricated according to the revised IC layout plan is sufficiently long to ensure the undesired particles 270 (if any are generated) are located far enough from the fabricated fin structures, so that they can be easily removed, while chip space/area is not unduly sacrificed due to the elongation of the gate structures.

Figure 19:
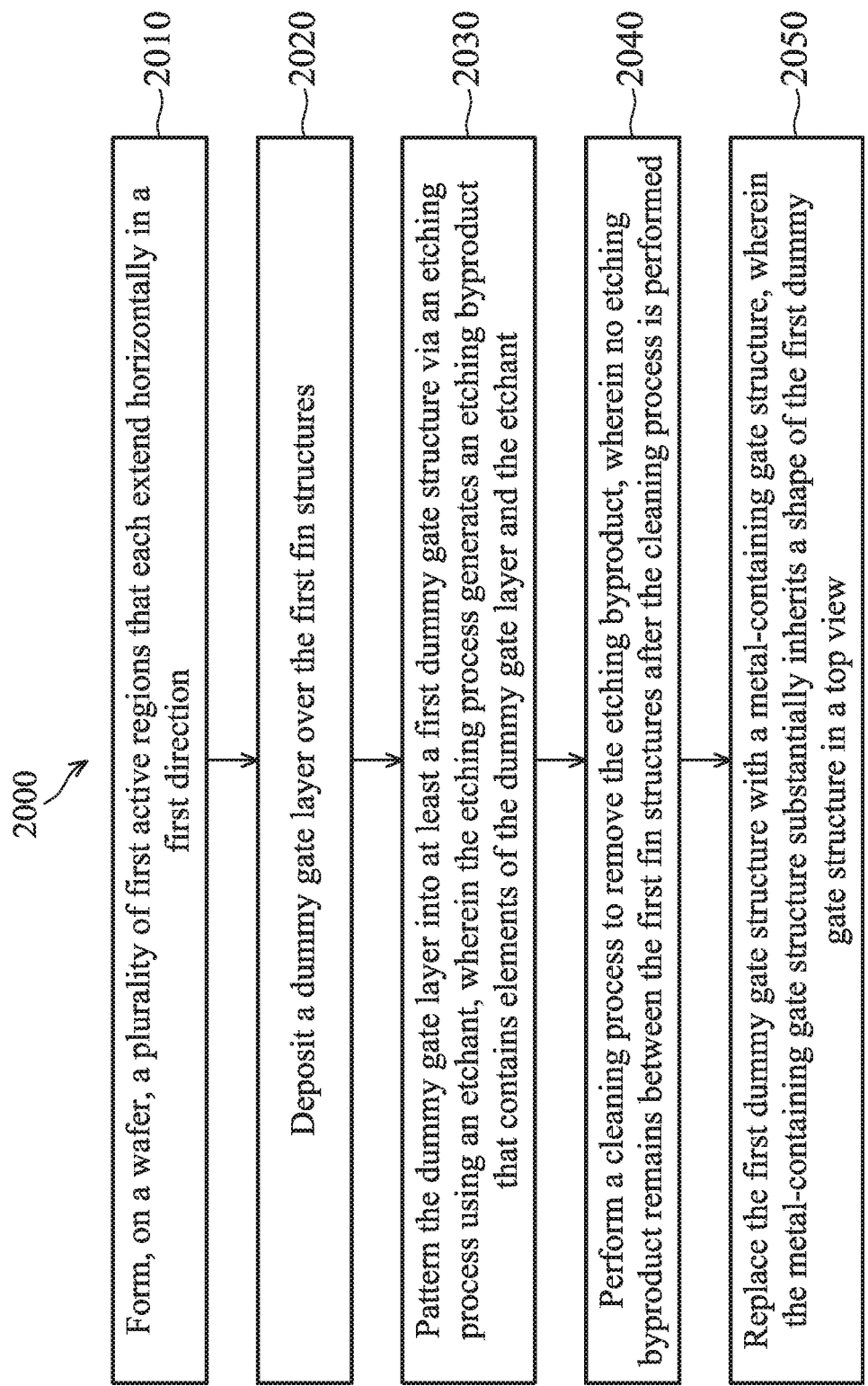
FIGS. 19-20 are flowcharts illustrating methods of fabricating a semiconductor device according to various aspects of the present disclosure.

FIG. 19 is a flowchart illustrating a method 2000 of fabricating a semiconductor device according to embodiments of the present disclosure. The method 2000 includes a step 2010 to form, on a wafer, a plurality of first active regions that each extend horizontally in a first direction. The first active regions include first fin structures that each protrude vertically upward over a substrate.

The method 2000 includes a step 2020 to deposit a dummy gate layer over the first fin structures.

The method 2000 includes a step 2030 to pattern the dummy gate layer into at least a first dummy gate structure via an etching process using an etchant. The etching process generates an etching byproduct that contains elements of the dummy gate layer and the etchant. The first dummy gate structure extends horizontally in a second direction different from the first direction.

The method 2000 includes a step 2040 to perform a cleaning process to remove the etching byproduct. No etching byproduct remains between the first fin structures after the cleaning process is performed.

The method 2000 includes a step 2050 to replace the first dummy gate structure with a metal-containing gate structure. The metal-containing gate structure substantially inherits a shape of the first dummy gate structure in a top view.

In some embodiments, the patterning of the dummy gate layer comprises forming a first end segment of the first dummy gate structure that extends beyond the first fin structures by a first distance that is at least 4 times as long as a pitch associated with the first fin structures.

It is understood that the method 2000 may include further steps performed before, during, or after the steps 2010-2050. For example, the method 2000 may include a step of forming, on the wafer, a plurality of second active regions that each extend in the first direction. The method 2000 may also include a step of forming a second dummy gate structure over the second active regions. The second dummy gate structure extends in the second direction and includes a second end segment that extends beyond the second active regions in the top view. The second end segment is shaped differently from the first end segment in the top view. In some embodiments, the patterning of the dummy gate layer comprises tapering an end segment of the first dummy gate structure. In some embodiments, the second end segment is shorter than the first end segment in the second direction. In some embodiments, the second end segment is less tapered than the first end segment in the top view. In some embodiments, the forming the second active regions comprises forming a plurality of second fin structures that have a lower pattern density than the first fin structures. In some embodiments, the forming the second active regions comprises forming non-fin structures as the second active regions. Other steps may include formation of vias, contacts, or metal layers, etc.

Figure 20:
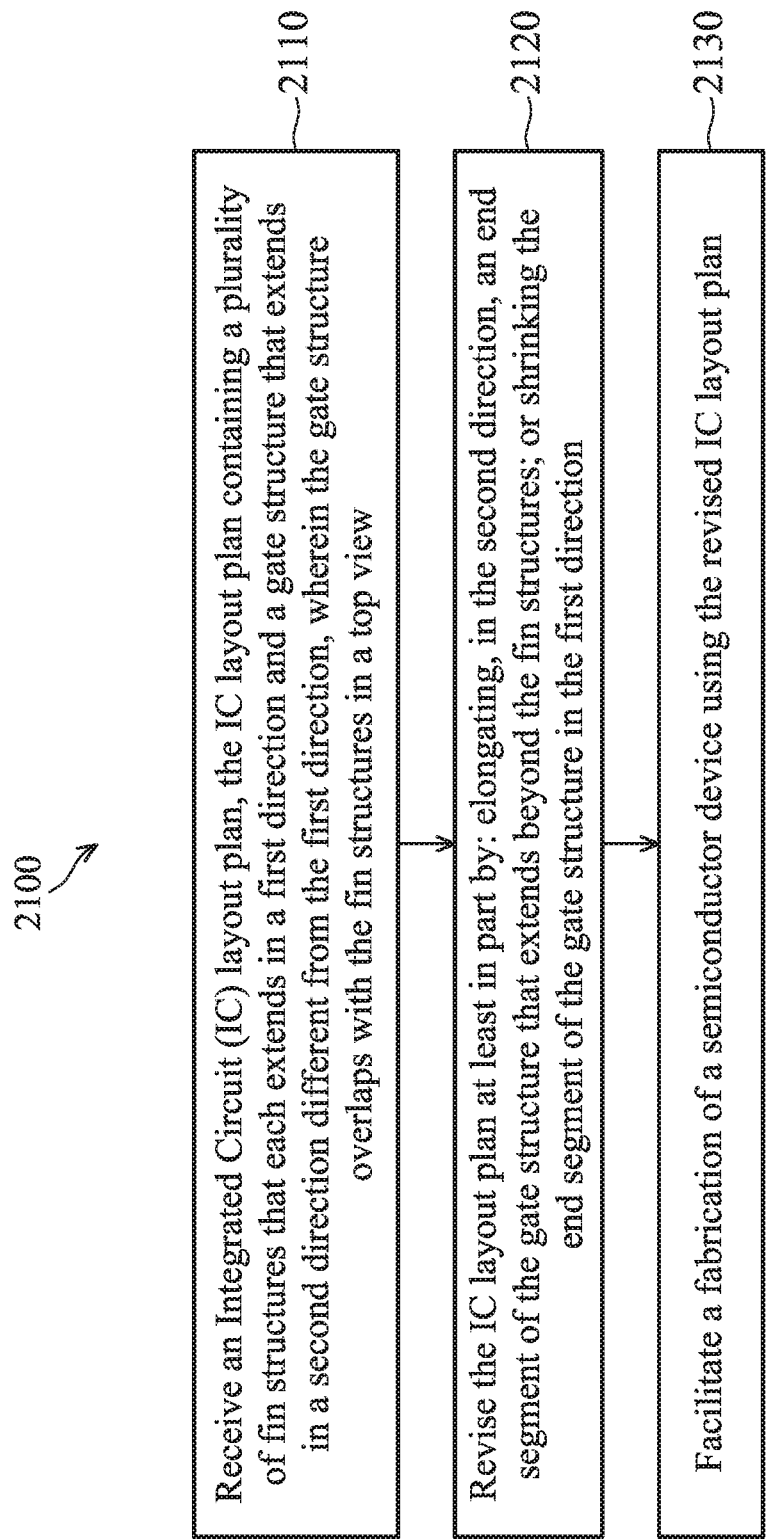

FIG. 20 is a flowchart illustrating a method 2100 of facilitating the fabrication of a semiconductor device according to embodiments of the present disclosure. The method 2100 includes a step 2110 to receive an Integrated Circuit (IC) layout plan. The IC layout plan contains a plurality of fin structures that each extends in a first direction and a gate structure that extends in a second direction different from the first direction. The gate structure overlaps with the fin structures in a top view. The method 2100 includes a step 2120 to revise the IC layout plan at least in part by: elongating, in the second direction, an end segment of the gate structure that extends beyond the fin structures; or shrinking the end segment of the gate structure in the first direction. The method 2100 includes a step 2130 to facilitate a fabrication of a semiconductor device using the revised IC layout plan. For example, a lithography mask may be manufactured according to the revised IC layout plan, and semiconductor devices may be fabricated using the lithography mask.

In some embodiments, the elongating is performed such that a distance between an outermost tip of the gate structure and a closest fin structure is at least 4 times as long as a pitch of the fin structures.

In some embodiments, the shrinking comprises shrinking a first portion of the end segment more than a second portion of the end segment. The first portion is located farther away from the fin structures than the second portion.

In some embodiments, the revising the IC layout plan comprises elongating and shrinking the end segment of the gate structure.

It is understood that the method 2100 may include further steps performed before, during, or after the steps 2110-2130. For example, the method 2100 may include steps of performing design rule checks on the IC layout plan, adding optical proximity correction (OPC) features to the IC layout plan, and/or performing other revisions to the IC layout plan, etc.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

It is also understood that the various aspects of the present disclosure discussed above may apply to multi-channel devices such as Gate-All-Around (GAA) devices. Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No.

10,361,278, titled "Method of Manufacturing a Semiconductor Device and a Semiconductor Device" and issued on Jul. 23, 2019, the disclosures of each which are hereby incorporated by reference in their respective entireties. To the extent that the present disclosure refers to a fin structure or FinFET devices, such discussions may apply equally to the GAA devices.

In summary, the present disclosure optimizes a profile of the gate of a transistor by making the end segment of the gate inwardly tapered, or by elongating the gate, or both. Optimizing the gate profile may offer advantages over conventional devices. However, it is understood that not all advantages are discussed herein, different embodiments may offer different advantages, and that no particular advantage is required for any embodiment. One advantage is that the present disclosure improves device performance and/or yield. For example, during the patterning of the dummy gate structures, etching residue or byproduct may be generated. Some of the etching residue or byproduct (e.g., particles) may be trapped by the vertically protruding fin structures and may be difficult to remove during cleaning. If such residue or byproduct still remains at the time the dummy gates are replaced by the high-k metal gates (HKMGs), the residue or byproduct may also be turned into HKMG-containing structures. These HKMG-containing structures may come into contact with IC device elements such as source/drain contacts, which could cause electrical shorting. Here, by tapering the end segment of the gate or by elongating the gate, any etching residue or byproduct generated may be located farther away from the fin structures, which makes their removal easier during the cleaning. And even if some of the residue or byproduct still remains after the cleaning, the fact that they are located farther away from the fin structures (and also from the to-be-formed source/drain contacts) will reduce the electrical shorting risk. As such, device performance (e.g., voltage breakdown or VBD) and yield may be improved. Another advantage is a larger etching window. For example, the definition of the dummy gate structures involves etching, and this etching window is now larger (e.g., can be performed in a longer duration or has more flexibility with respect to the etchant) due to the greater confidence that etching residue or byproduct will be more likely to be removed, and that any remaining etching residue or byproduct is less likely to cause electrical shorting. Other advantages may include compatibility with existing fabrication processes and the ease and low cost of implementation.

One aspect of the present disclosure pertains to a device. The device includes a plurality of fin structures that each protrude vertically upwards out of a substrate and each extend in a first direction in a top view. A gate structure is disposed over the fin structures. The gate structure extends in a second direction in the top view. The second direction is different from the first direction. The fin structures have a fin pitch equal to a sum of: a dimension of one of the fin structures in the second direction and a distance between an adjacent pair of the fin structures in the second direction. An end segment of the gate structure extends beyond an edge of a closest one of the fin structures in the second direction. The end segment has a tapered profile in the top view or is at least 4 times as long as the fin pitch in the second direction.

Another aspect of the present disclosure pertains to a method. The method includes forming, on a wafer, a plurality of first active regions that each extend horizontally in a first direction. The first active regions include first fin structures that each protrude vertically upward over a substrate. The method includes depositing a dummy gate layer over the first fin structures. The method includes patterning the dummy gate layer into at least a first dummy gate structure via an etching process using an etchant. The etching process generates an etching byproduct that contains elements of the dummy gate layer and the etchant. The first dummy gate structure extends horizontally in a second direction different from the first direction. The method includes performing a cleaning process to remove the etching byproduct. No etching byproduct remains between the first fin structures after the cleaning process is performed. The method includes replacing the first dummy gate structure with a metal-containing gate structure. The metal-containing gate structure substantially inherits a shape of the first dummy gate structure in a top view.

Yet another aspect of the present disclosure pertains to a method. The method includes receiving an Integrated Circuit (IC) layout plan. The IC layout plan contains a plurality of fin structures that each extends in a first direction and a gate structure that extends in a second direction different from the first direction. The gate structure overlaps with the fin structures in a top view. The IC layout plan is revised at least in part by: elongating, in the second direction, an end segment of the gate structure that extends beyond the fin structures; or shrinking the end segment of the gate structure in the first direction.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
  a plurality of fin structures that each protrude vertically upwards out of a substrate and each extend in a first direction in a top view; and
  a gate structure disposed over the fin structures, wherein the gate structure extends in a second direction in the top view, the second direction being different from the first direction;
  wherein:
  the fin structures have a fin pitch equal to a sum of: a dimension of one of the fin structures in the second direction and a distance between an adjacent pair of the fin structures in the second direction;
  an end segment of the gate structure extends beyond an edge of a closest one of the fin structures in the second direction;
  the end segment is at least 4 times as long as the fin pitch in the second direction;
  a first portion of the end segment is inwardly tapered;
  a second portion of the end segment is outwardly tapered; and
  the first portion and the second portion of the end segment collectively define a concave recess in the top view.
2. The device of claim 1, wherein:
  the plurality of fin structures are first fin structures having a first pattern density;
  the gate structure is a first gate structure;

the device further comprises a plurality of second fin structures having a second pattern density lower than the first pattern density and a second gate structure disposed over the second fin structures; and
an end segment of the second gate structure has a different top view profile than the end segment of the first gate structure.

3. The device of claim 2, wherein the end segment of the second gate structure is less tapered or is shorter than the end segment of the first gate structure.

4. The device of claim 1, wherein the gate structure is a first gate structure, and wherein the device further comprises a plurality of active regions of planar devices disposed within the substrate and a second gate structure disposed over the active regions of planar devices; and
an end segment of the second gate structure has a different top view profile than the end segment of the first gate structure.

5. The device of claim 4, wherein the end segment of the second gate structure is less tapered or is shorter than the end segment of the first gate structure.

6. The device of claim 1, wherein a maximum dimension of the first portion of the end segment and a maximum dimension of a second portion of the end segment is less than a maximum dimension of a rest of the gate structure.

7. A device, comprising:
a plurality of active regions that each extend in a first direction in a top view; and
a gate structure that extends in a second direction in the top view, the second direction being different from the first direction, wherein a dimension of the gate structure in the first direction gradually shrinks as the gate structure extends farther out beyond the active regions until a first point is reached, after which the dimension of the gate structure in the first direction gradually expands as the gate structure extends farther in the second direction, such that the gate structure defines a concave portion that curves inwardly;
wherein:
a portion of the gate structure extends beyond an edge of a closest one of the active regions by a first distance in the second direction in the top view;
the active regions have a pitch that is a sum of: a dimension of one of the active regions in the second direction and a distance between an adjacent pair of the active regions in the second direction; and
the first distance is longer than the pitch.

8. The device of claim 7, wherein the active regions include fin structures or stacks of nano-structures, and wherein the fin structures or the stacks of nano-structures protrude vertically out of a substrate in a cross-sectional view.

9. The device of claim 7, wherein the gate structure is a first gate structure, and wherein the device further comprises:
a second gate structure that extends in the second direction, wherein a dimension of the second gate structure in the first direction gradually shrinks as the second gate structure extends farther out beyond the active regions; and
a source/drain contact that extends in the second direction, wherein the source/drain contact is disposed between the first gate structure and the second gate structure, and wherein an end portion of the source/drain contact has an outwardly-protruding top view profile.

10. The device of claim 9, wherein the first gate structure or the second gate structure is substantially longer than the source/drain contact in the second direction.

11. The device of claim 7, wherein:
the active regions are first active regions;
the gate structure is a first gate structure;
the device further comprises a plurality of second active regions and a second gate structure disposed over the second active regions;
the second active regions have greater spacings therebetween than the first active regions; and
an end segment of the second gate structure has a different top view profile than the end segment of the first gate structure.

12. The device of claim 11, wherein:
an end segment of the first gate structure is more tapered than an end segment of the second gate structure; or
the first gate structure is longer than the second gate structure in the second direction.

13. The device of claim 7, wherein:
the gate structure is a first gate structure;
the active regions are first active regions that protrude vertically out of a substrate in a cross-sectional view;
the device further comprises a plurality of second active regions and a second gate structure disposed over the second active regions in the top view;
the second active regions are embedded in, but do not protrude vertically out of, the substrate; and
an end segment of the second gate structure has a different top view profile than the end segment of the first gate structure.

14. The device of claim 13, wherein:
an end segment of the first gate structure is more tapered than an end segment of the second gate structure; or
the first gate structure is longer than the second gate structure in the second direction.

15. The device of claim 7, wherein a length of the first distance is between about 4 times and about 8 times of a length of the pitch.

16. A device, comprising:
a plurality of first active regions that each extend in a first direction in a top view, the first active regions have a first pattern density and a first pitch; and
a first gate structure that spans across the first active regions in a second direction in the top view, the second direction being different from the first direction;
a plurality of second active regions that each extend in the first direction, the second active regions have a second pattern density less than the first pattern density; and
a second gate structure that spans across the second active regions in the second direction;
wherein:
a first end segment of the first gate structure has a more inwardly tapered top view profile than a second end segment of the second gate structure;
the first end segment extends beyond an outermost one of the first active regions by a first distance;
the first distance is greater than 4 times of the first pitch;
the second active regions have a second pitch;
the second end segment extends beyond an outermost one of the second active regions by a second distance; and
the second distance is less than 3 times of the second pitch.

17. The device of claim 16, wherein the second end segment has an outwardly-protruding top view profile.

18. The device of claim 16, the first gate structure is longer than the second gate structure in the second direction.

19. The device of claim 16, wherein the first gate structure, but not the second gate structure, is a part of a FinFET device or a part of a gate-all-around (GAA) device.

20. The device of claim 16, wherein the first end segment of the first gate structure defines a concave recess in the top view.

* * * * *